(12) United States Patent
Nakata

(10) Patent No.: US 7,238,968 B2
(45) Date of Patent: Jul. 3, 2007

(54) SEMICONDUCTOR DEVICE AND METHOD OF MAKING THE SAME

(76) Inventor: Josuke Nakata, 29-3, Goryoooeyama-cho, 4-chome, Nishikyo-ku, Kyoto-shi, Kyoto, 610-1102 (JP)

( * ) Notice: Subject to any disclaimer, the term of this patent is extended or adjusted under 35 U.S.C. 154(b) by 0 days.

(21) Appl. No.: 10/485,843

(22) PCT Filed: Aug. 13, 2001

(86) PCT No.: PCT/JP01/06973

§ 371 (c)(1),
(2), (4) Date: Feb. 26, 2004

(87) PCT Pub. No.: WO03/017383

PCT Pub. Date: Feb. 27, 2003

(65) Prior Publication Data

US 2005/0067622 A1    Mar. 31, 2005

(51) Int. Cl.
*H01L 33/00* (2006.01)
(52) U.S. Cl. .............. 257/113; 257/E31.039; 438/81
(58) Field of Classification Search ............ 257/80, 257/81, 82, 113, 414, 431, 461, 465, E31.038, 257/E31.039, E33.006; 438/48, 49, 81
See application file for complete search history.

(56) References Cited

U.S. PATENT DOCUMENTS

| 3,038,952 | A |   | 6/1962  | Ralph |
| 3,350,775 | A |   | 11/1967 | Iles |
| 3,433,676 | A |   | 3/1969  | Stein |
| 3,998,659 | A |   | 12/1976 | Wakefield |
| 4,021,323 | A |   | 5/1977  | Kilby et al. |
| 4,126,812 | A |   | 11/1978 | Wakefield |
| 4,136,436 | A | * | 1/1979  | Kilby et al. ............ 438/63 |
| 4,224,081 | A |   | 9/1980  | Kawamura et al. |
| 4,581,103 | A |   | 4/1986  | Levine et al. |
| 4,582,588 | A |   | 4/1986  | Jensen et al. |
| 4,583,588 | A |   | 4/1986  | Franzolini et al. |
| 4,691,076 | A |   | 9/1987  | Levine et al. |
| 5,028,546 | A |   | 7/1991  | Hotchkiss |
| 5,419,782 | A |   | 5/1995  | Levine et al. |
| 5,428,249 | A |   | 6/1995  | Sawayama et al. |
| 5,431,127 | A |   | 7/1995  | Stevens |
| 5,469,020 | A |   | 11/1995 | Herrick |
| 5,498,576 | A |   | 3/1996  | Hotchkiss et al. |

(Continued)

FOREIGN PATENT DOCUMENTS

| EP | 0 982 780  | 3/2000 |
| EP | 1 255 303  | 11/2002 |
| GB | 1195547    | 6/1970 |
| JP | 1-179374   | 7/1989 |
| JP | 5-36997    | 2/1993 |
| JP | 6-013633   | 1/1994 |
| JP | 8-199513   | 8/1996 |
| JP | 9-49213    | 2/1997 |

(Continued)

*Primary Examiner*—Thomas L. Dickey
(74) *Attorney, Agent, or Firm*—Jordan and Hamburg LLP

(57) ABSTRACT

The present invention presents a semiconductor device (10) which is adapted to a solar cell, and in which a semiconductor element (1) is produced by forming one flat surface (2) on a spherical or substantially spherical silicon single crystal (1*a*, 1*b*). A diffusion layer (3) and a substantially spherical pn junction (4) are formed on this semiconductor element (1), and a diffusion-mask thin film (5) and a positive electrode (6*a*) are formed on the flat surface (2). A negative electrode 6*b* is formed at the apex on the opposite side to the positive electrode (6*a*), and an antireflection film (7) is formed on the surface side of the diffusion layer (3).

26 Claims, 15 Drawing Sheets

U.S. PATENT DOCUMENTS

| | | |
|---|---|---|
| 5,538,902 A | 7/1996 | Izu et al. |
| 5,785,768 A * | 7/1998 | Nakata ................... 136/250 |
| 6,204,545 B1 * | 3/2001 | Nakata ................... 257/459 |
| 6,265,242 B1 | 7/2001 | Komori et al. |
| 6,294,822 B1 * | 9/2001 | Nakata ................... 257/461 |
| 6,355,873 B1 | 3/2002 | Ishikawa |
| 7,109,528 B2 | 9/2006 | Nakata |
| 2004/0238833 A1 | 12/2004 | Nakata |
| 2005/0067622 A1 | 3/2005 | Nakata |
| 2005/0127379 A1 | 6/2005 | Nakata |
| 2006/0043390 A1 | 3/2006 | Nakata |
| 2006/0086384 A1 | 4/2006 | Nakata |
| 2006/0133073 A1 | 6/2006 | Nakata et al. |
| 2006/0169992 A1 | 8/2006 | Nakata |

FOREIGN PATENT DOCUMENTS

| | | |
|---|---|---|
| JP | 09-162434 | 6/1997 |
| JP | 9-162434 | 6/1997 |
| JP | 10-33969 | 2/1998 |
| JP | 2000-22184 | 1/2000 |
| JP | 2000-259992 | 9/2000 |
| JP | 2001-102618 | 4/2001 |
| JP | 2001-119093 | 4/2001 |
| JP | 2001-156315 | 6/2001 |
| JP | 2001-168369 | 6/2001 |
| JP | 2001-177132 | 6/2001 |
| JP | 2001156315 A * | 6/2001 |
| JP | 2001-210834 | 8/2001 |
| JP | 2001-210848 | 8/2001 |
| JP | 2001-267609 | 9/2001 |
| JP | 2002-50780 | 2/2002 |
| JP | 2002-164554 | 6/2002 |
| WO | 98/15983 | 4/1998 |
| WO | WO 9815983 A1 * | 4/1998 |
| WO | WO-98/36461 | 8/1998 |
| WO | 99/10935 | 3/1999 |
| WO | WO 9910935 A1 * | 3/1999 |
| WO | WO- 02/35612 | 5/2002 |
| WO | WO- 02/35613 | 5/2002 |

* cited by examiner

SEMICONDUCTOR DEVICE AND METHOD OF MAKING THE SAME

TECHNICAL FIELD

The present invention relates to a semiconductor device with a light emitting or light receiving function that incorporates a plurality of substantially spherical semiconductor devices, and to the making method thereof. This semiconductor device can be applied to a variety of applications such as a solar cell panel, a lighting panel, a display, and a semiconductor photocatalyst.

BACKGROUND ART

Conventionally, research has been directed toward a technology that involves forming a pn junction, via a diffusion layer, on a surface of a small-diameter spherical semiconductor element made of a p-type or n-type semiconductor and then connecting a plurality of these spherical semiconductor elements in parallel to a common electrode, this technology being put to practical use for solar cells, semiconductor photocatalysts, and so forth.

U.S. Pat. No. 3,998,659 discloses an example in which a solar cell is constituted by forming a p-type diffusion layer on the surface of a n-type spherical semiconductor, connecting the respective diffusion layers of a plurality of spherical semiconductors to a common film-like electrode (positive electrode), and then connecting the n-type core sections of these spherical semiconductors to a common film-like electrode (negative electrode).

U.S. Pat. No. 4,021,323 discloses a solar energy converter (semiconductor module) having the following constitution. Plural p-type spherical semiconductor elements and plural n-type spherical semiconductor elements are placed in series, and connected to a common film-like electrode, and respective diffusion layers of these semiconductor elements are made into contact with a common electrolytic solution, and then by irradiating with solar light, electrolysis of the electrolytic solution is induced.

So too in the case of the modules having spherical cells appearing in U.S. Pat. Nos. 4,582,588 and 5,469,020, because the spherical cells are attached by being connected to a sheet-like common electrode, a plurality of spherical cells are suitable for connecting in parallel. However, they are not suitable for serial connection.

On the other hand, as shown in International Patent Publication Nos. WO98/15983 and WO99/10935, the inventor of the present invention has proposed a granular light emitting or light receiving semiconductor device in which a diffusion layer, pn junction, and a pair of electrodes are formed on a spherical semiconductor element made of a p-type semiconductor or an n-type semiconductor. Also, proposed is a semiconductor module, which is produced by connecting a plurality of the semiconductor device in series and then connecting a plurality of the serially connected bodies in parallel, and which can be applied to a solar cell, a photocatalyst device for electrolysis of water and so forth, a variety of light emitting devices, and color displays, and the like.

In the case of this semiconductor module, when any semiconductor device of any serially connected body enters an open state due to failure, current no longer flows to the serial circuit including above failed semiconductor element, and the remaining normal semiconductor devices in the serially connected body also enter a breakdown state, whereby dropping of the output of the semiconductor module is generated.

In addition, in the case of the spherical semiconductor devices having the positive and negative electrodes that were proposed by the present inventor, handling is a problem because the device is prone to rolling, and it is not easy to determine the position for forming the positive and negative electrodes nor to distinguish the positive and negative electrodes during assembly.

Therefore, the inventor of this application undertook research with respect to a technology for forming a pair of flat surfaces on a spherical semiconductor element and then for forming electrodes on these flat surfaces. However, not only was there then a large number of processes for the electrode formation, it also became evident that it was still not easy to distinguish between the positive and negative electrodes and that this technology was not very advantageous in terms of mass producing the semiconductor module by using a multiplicity of spherical semiconductor devices.

An object of the present invention is accordingly to provide a substantially spherical semiconductor device having one flat surface, is not prone to rolling and can be handled easily. Another object of the present invention is to provide a semiconductor device in which a first electrode is formed on the flat surface and a second electrode is formed at the apex on the opposite side to this electrode such that the center of the semiconductor device is interposed between the first and second electrodes, and in which the positive and negative electrodes can be easily distinguished. A further object of the present invention is to provide a making method for this semiconductor device.

DISCLOSURE OF THE INVENTION

The semiconductor device according to the present invention comprises: a semiconductor element, which has a flat surface formed by removing an apex part of a substantially spherical semiconductor crystal made of a p-type or n-type semiconductor; a diffusion layer or semiconductor thin-film deposition layer formed on the surface of the semiconductor element excluding the flat surface and a substantially spherical pn junction formed via the diffusion layer or semiconductor thin-film deposition layer; and first and second electrodes, which are provided on the flat surface and at the apex on the opposite side to the flat surface respectively so as to face each other with the center of the semiconductor element interposed therebetween, and which are connected to both ends of the pn junction.

Further, a semiconductor device making method according to the present invention comprises: a first step of making a substantially spherical semiconductor crystal made of a p-type or n-type semiconductor; a second step of producing a semiconductor element which has a flat surface formed by removing an apex part of the semiconductor crystal; a third step of forming a diffusion layer or semiconductor thin-film deposition layer on the surface of the semiconductor element excluding the flat surface and forming a substantially spherical pn junction via the diffusion layer or semiconductor thin-film deposition layer; and a fourth step of forming first and second electrodes, which are connected to the two ends of the pn junction, on the flat surface and at the apex on the opposite side to the flat surface respectively so that these electrodes face each other with the center of the semiconductor element interposed therebetween.

BRIEF DESCRIPTION OF THE DRAWINGS

FIGS. 1(a) and 1(b) are cross-sectional views of a spherical semiconductor crystal and a substantially spherical semiconductor crystal respectively;

FIG. 2 is a cross-sectional view of a semiconductor element having a flat surface;

FIG. 3 is a cross-sectional view of a semiconductor element having a diffusion-mask thin film;

FIG. 4 is a cross-sectional view of the semiconductor element in FIG. 3, an acid-resistant sheet and an acid-resistant wax;

FIG. 5 is a cross-sectional view of a semiconductor element on which a partial diffusion-mask thin film remains;

FIG. 6 is a cross-sectional view of a semiconductor element having a diffusion layer, a pn junction and an antireflection film;

FIG. 7 is a cross-sectional view of a semiconductor element with pasting an electrode-forming aluminum paste and silver paste to the semiconductor element of FIG. 6;

FIG. 8 is a cross-sectional view of a semiconductor element having a pair of electrodes formed by heat-treating the semiconductor element of FIG. 7.

FIG. 9 is a plan view of a lead frame;

FIG. 10 is a cross-sectional view of the lowest lead frame and paste;

FIG. 11 is a cross-sectional view of an intermediate lead frame and paste;

FIG. 12 is a plan view of an assembly body produced by integrating a plurality of semiconductor devices and a plurality of lead frames;

FIG. 13 is a front view of the assembly body;

FIG. 14 is a plan view of a lead frame, and three sets of semiconductor modules molded with a light transmitting member made of a transparent synthetic resin;

FIG. 15 is a cross-sectional view along the line XV-XV in FIG. 14;

FIG. 16 is a plan view of a semiconductor module;

FIG. 17 is a front view of a semiconductor module; and

FIG. 18 is an equivalent circuit of the semiconductor module.

FIG. 19 is a plan view of a lead frame and a one-set semiconductor module molded with a light transmitting member made of a transparent synthetic resin, relating to a second modified embodiment;

FIG. 20 is a cross-sectional view along the line XX-XX in FIG. 19;

FIG. 21 is a plan view of a semiconductor module relating to a third modified embodiment; and FIG. 22 is a cross-sectional view along the line XXII-XXII in FIG. 21.

FIG. 23 is a plan view of a base sheet relating to a fourth modified embodiment;

FIG. 24 is a plan view of the base sheet with connecting leads;

FIG. 25 is a plan view of a base sheet on which the semiconductor devices are mounted;

FIG. 26 shows an end face view of an assembly body produced by assembling the base sheet and semiconductor devices;

FIG. 27 shows an end face view of a semiconductor module comprising the base sheet, semiconductor devices and a light transmitting member;

FIG. 28 shows the end face view of the semiconductor module in which the semiconductor module in FIG. 27 is partially modified;

FIG. 29 is a plan view of a base sheet different from the one mentioned above; and FIG. 30 is a vertical cross-sectional view of the base sheet in FIG. 29.

FIG. 31 is a cross-sectional view of a semiconductor element relating to a fifth modified embodiment;

FIG. 32 is a cross-sectional view of a semiconductor element having a silicon growth layer and a pn junction on the semiconductor element in FIG. 31;

FIG. 33 is a cross-sectional view of a semiconductor element having an antireflection film on the semiconductor element in FIG. 32; and FIG. 34 is a cross-sectional view of a semiconductor device having positive and negative electrodes on the semiconductor element in FIG. 33.

FIG. 35 is a cross-sectional view of a semiconductor element relating to a sixth modified embodiment;

FIG. 36 is a cross-sectional view of a semiconductor element having a p-type base layer on the semiconductor element in FIG. 35;

FIG. 37 is a cross-sectional view of a semiconductor element having an n-type emitter layer on the semiconductor element in FIG. 36; and FIG. 38 is a cross-sectional view of an npn phototransistor.

MOST PREFERRED EMBODIMENT OF THE INVENTION

Embodiments of the present invention will be described hereinbelow on the basis of the drawings. First of all, the semiconductor device will be described as a solar cell that is incorporated into a semiconductor module.

Figure 6:
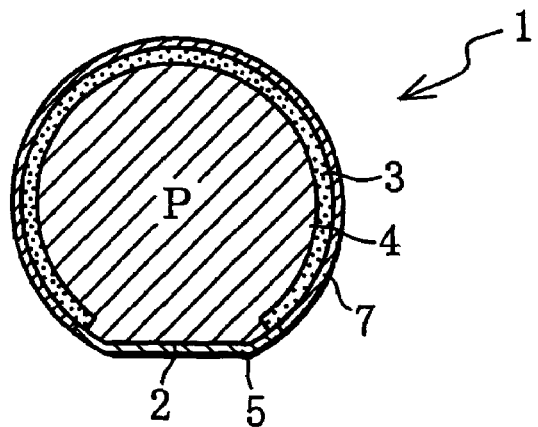
Figure 7:
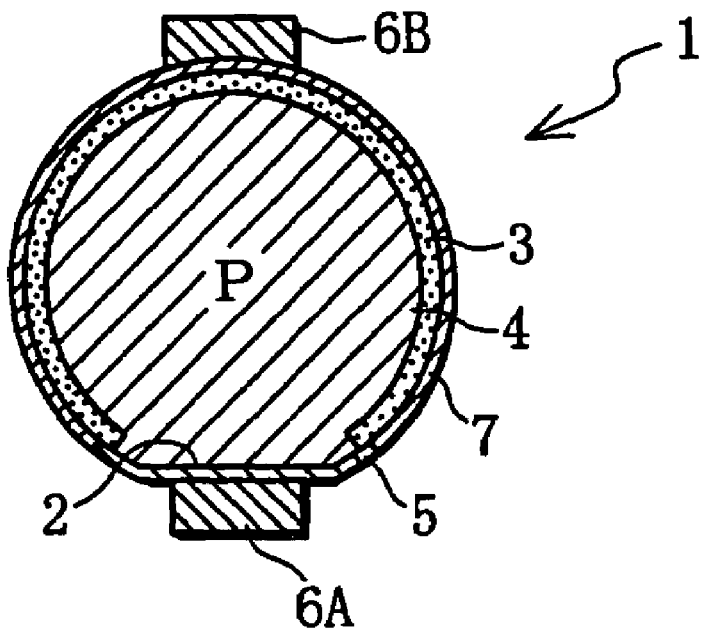
Figure 8:
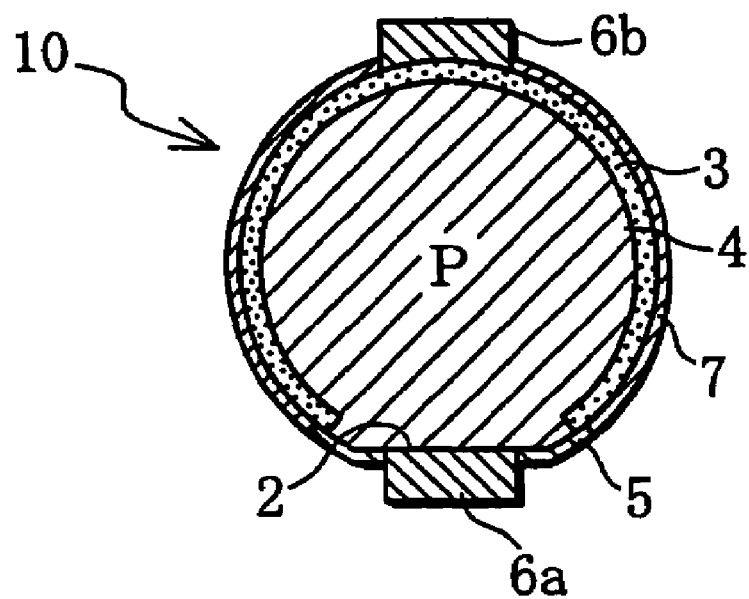

FIGS. 1 to 8 show a making method of a light receiving semiconductor device 10 as a solar cell. FIG. 8 is a cross-sectional view of a finished light receiving semiconductor device 10.

As shown in FIG. 8, the light receiving semiconductor device 10 comprises a semiconductor element 1 that has a flat surface 2 formed by removing an apex portion of a substantially spherical semiconductor crystal 1a made of a p-type semiconductor; an $n^+$ type diffusion layer 3; a substantially spherical pn junction 4 that is formed via the diffusion layer 3; a diffusion-mask thin film 5 made of a silicon oxide film; a pair of electrodes 6a and 6b (positive electrode 6a, and negative electrode 6b); and an antireflection film 7, and so forth. Additionally, instead of above diffusion layer 3, semiconductor thin-film deposition layer can be applicable.

The semiconductor element 1 is made of a spherical semiconductor crystal 1a (see FIG. 1(a)) with a diameter of 1.5 mm, for example, made of a p-type silicon single crystal that has a resistivity of about 1 Ωcm. However, a substantially spherical semiconductor crystal 1b with substantially the same diameter made of the silicon single crystal shown in FIG. 1(b) can also be adopted in place of the semiconductor crystal 1a.

Figure 2:
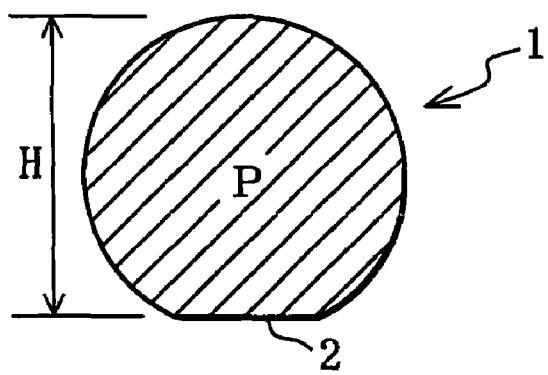

As shown in FIG. 2, a flat surface 2 with a diameter of 0.7 mm to 0.9 mm, for example, is formed at one of a pair of apexes that face each other with the center of the semiconductor element 1 interposed therebetween. The respective heights H of a multiplicity of semiconductor elements 1 of the same type are made uniform at a fixed height that is 1.3 to 1.35 mm, for example. This serves to facilitate assembly in a semiconductor module 20, as will be described subsequently.

The n$^+$ type diffusion layer 3 is formed over the majority of the surface of the semiconductor element 1 excluding the flat surface 2; the diffusion-mask thin film 5 (thickness 0.6 to 0.7 µm, for example) is formed on the flat surface 2 and in the vicinity of the perimeter thereof; and the diffusion layer 3 is not formed on the flat surface 2 and in the vicinity of the perimeter thereof. The diffusion layer 3 is a 0.4 to 0.5 µm thick n$^+$ type diffusion layer in which phosphorus is diffused as the n-type doping impurity. The substantially spherical pn junction 4 (precisely, a pn$^+$ junction) is formed on the semiconductor element 1 via this diffusion layer 3. The positive electrode 6a, which electrically is connected to the p-type silicon single crystal of the semiconductor element 1 by penetrating the diffusion-mask thin film 5, is formed on the flat surface 2 of the semiconductor element 1. The negative electrode 6b, which electrically is connected to the n-type diffusion layer 3 by penetrating the antireflection film 7, is formed at the apex of the semiconductor element 1, on the opposite side of the positive electrode 6a with the center of the semiconductor element 1 interposed between the negative electrode 6b and the positive electrode 6a. The positive electrode 6a is produced by causing an aluminum paste to adhere to the semiconductor element 1 and then sintering this paste, while the negative electrode 6b is produced by causing a silver paste to adhere to the semiconductor element 1 and then sintering this paste. The antireflection film 7 consists of a phosphorus-containing silicon oxide film (of thickness 0.6 to 0.7 µm, for example). The antireflection film 7 is formed so as to cover the whole surface of the semiconductor element 1 excluding the diffusion-mask thin film 5, and, together with the diffusion-mask thin film 5, covers substantially the whole surface of the semiconductor element 1. Further, the structure of the semiconductor device 10 will also be made clearer from the description of the making method of the semiconductor device 10 described hereinbelow.

In the case of the semiconductor device 10, the substantially spherical pn junction 4 has a photoelectric conversion function, performing photoelectric conversion upon receipt of solar power to generate an electromotive force whose maximum is approximately 0.6 volt between the positive electrode 6a and the negative electrode 6b. The semiconductor device 10 has a substantially spherical pn junction 4, the positive electrode 6a being formed on the flat surface 2 and the negative electrode 6b being formed in a position on the opposite side to the positive electrode 6a and in a position corresponding to the center of the diffusion layer 4. The semiconductor device 10 therefore also has uniform optical sensitivity with respect to incident light from all directions with the exception of the direction defined by the two electrodes 6a and 6b.

Due to the flat surface 2 being formed, and because the positive electrode 6a is formed on the flat surface 2 and the negative electrode 6b is formed at the apex on the opposite side to the flat surface 2, the semiconductor device 10 is not prone to rolling. The flat surface 2 permits adsorption when adsorbed by a vacuum pincette, a plurality of semiconductor elements 1 can be easily aligned with uniform orientation, and can be easily handled. Moreover, the positive electrode 6a and the negative electrode 6b can be easily distinguished by means of a sensor or visual observation, whereby the operating efficiency when a multiplicity of the semiconductor device 10 is assembled in a semiconductor module can be raised. Moreover, there is no need to form a flat surface in order to form the negative electrode 6b, and hence the steps for the electrode formation can be reduced, this being advantageous also with respect to the reduction in the fabrication costs of the semiconductor element 1.

Figure 1:
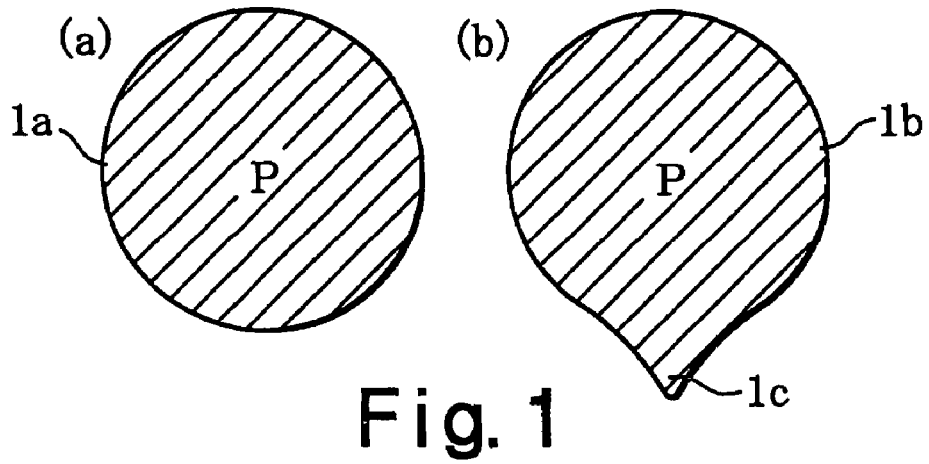
FIGS. 1 to 38 show embodiments of the present invention.

Next, the method for making the semiconductor device 10 will be described with reference to FIGS. 1 to 8. Initially, as shown in FIG. 1(a), a multiplicity of spherical or substantially spherical semiconductor crystals 1a made of a p-type single crystal with a diameter of 1.5 mm and a resistivity of about 1 Ωm, for example, is fabricated. This spherical semiconductor crystal 1a can be fabricated by means of the method already proposed by the present inventors in Japanese Patent Laid Open application No. H10-33969 and International Patent Publication No. WO98/15983, and so forth. In these methods, a drop tube is adopted and a sphere of a substantially spherical silicon single crystal is fabricated by causing silicon grains constituting the source material to drop freely after being melted in a floating state within the upper end of the drop tube, while causing these grains to solidify with the spherical shape maintained by the surface tension. Further, during the fabrication of the semiconductor crystal 1a, minute protrusions and recesses, are sometimes generated in the semiconductor crystal 1a due to primary factors such as contraction during solidification. However, a spherical or substantially spherical semiconductor crystal may also be fabricated by chemical mechanical polishing method without using the drop tube.

Here, in place of the multiplicity of semiconductor crystals 1a, a multiplicity of semiconductor crystals 1b with the protrusion 1c shown in FIG. 1(b) may be adopted. Although this semiconductor crystal 1b has same diameter and resistivity with those of the semiconductor crystal 1a, when the semiconductor crystal 1b is fabricated, the semiconductor crystal 1b of substantially spherical silicon single crystal can be made by burning silicon powder to a fine powder while guiding this fine powder into a fluidized bed reactor together with a fast-flowing monosilane/hydrogen mixed gas and then decomposing the monosilane by heating same to 600 to 700° C., for example.

Next, as shown in FIG. 2, an apex part of the surface of the semiconductor crystal 1a (or the semiconductor crystal 1b) is subjected to flat-surface processing by chemical mechanical polishing to form the flat surface 2 with a diameter of about 0.7 to 0.9 mm, whereby the semiconductor element 1 shown in FIG. 2 is fabricated. Here, when the protrusion 1c is present on the surface as in the case of the semiconductor crystal 1b, the flat surface 2 is formed by removing the protrusion 1c. When a protrusion or recess is present on the surface of the semiconductor crystal 1a, the flat surface 2 is formed by removing the protrusion or recess, and a semiconductor element 1 with a height H of 1.3 to 1.35 mm is made. When the flat surface 2 is formed, a polishing process in a state where a multiplicity of the semiconductor crystals 1a (or semiconductor crystals 1b) is fixed to a glass plate using wax or a synthetic resin (wrapping process) is performed. Moreover, a polishing process is performed on a multiplicity of semiconductor crystals 1a so that the respective heights H of a multiplicity of semiconductor elements 1 are equal at about 1.3 to 1.35 mm, for example.

By forming the flat surface 2, in addition to allowing removal of parts of the surface of the semiconductor crystals 1a and 1b which exhibit unstable quality, the heights H of the multiplicity of semiconductor elements 1 can be made uniform, and hence such formation is advantageous when the semiconductor module 20 (described later) is fabricated.

Figure 3:
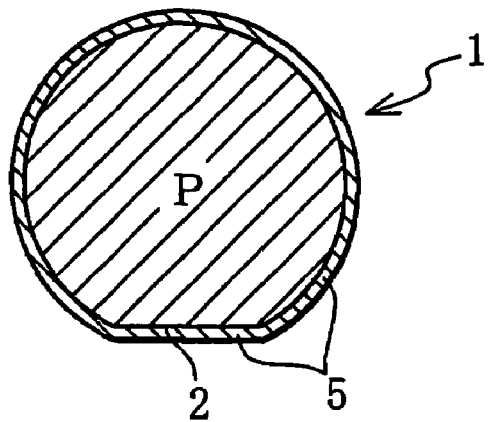

Next, as shown in FIG. 3, the diffusion-mask thin film 5 (with a film thickness of 0.6 to 0.7 µm, for example)

consisting of a silicon oxide film is formed over the whole surface of the semiconductor element 1 by means of thermal oxidation.

Figure 4:
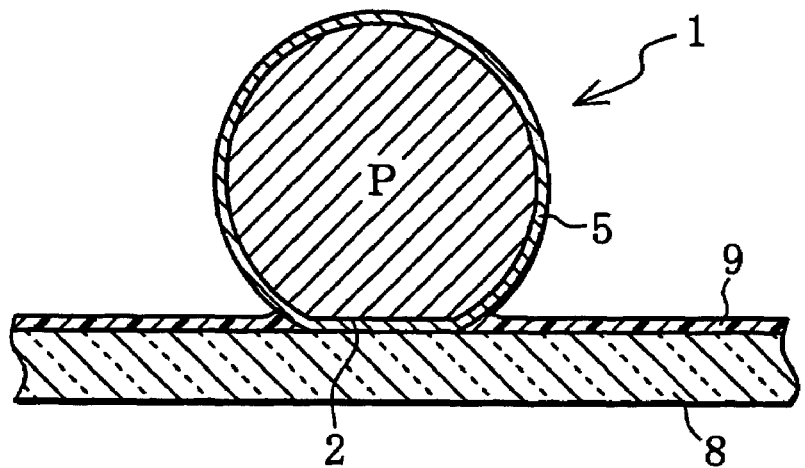
Figure 5:
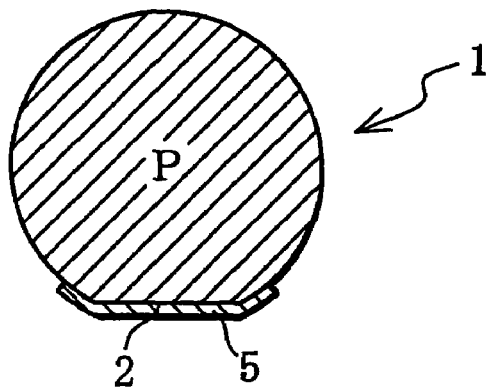

Next, as shown in FIG. 4, an acid-resistant wax 9 is coated on an acid-resistant sheet 8, and, in a state where the wax is caused to melt by heating the same, the flat surface 2 of the multiplicity of semiconductor elements 1 is bonded by being made to contact the acid-resistant sheet 8 so as to adhere thereto. Next, the acid-resistant sheet 8, wax 9, and the multiplicity of semiconductor elements 1 are immersed in etching solution, which is produced by mixing together hydrofluoric acid (HF) and ammonium fluoride ($NH_4F$), and the diffusion-mask thin film 5, which is not covered by the acid-resistant wax 9, is then removed by etching. When the wax 9 is then removed as a result of being dissolved, the semiconductor element 1 shown in FIG. 5 is obtained. In the case of the semiconductor element 1, the diffusion-mask thin film 5 remains only on the flat surface 2 of the semiconductor element 1 and in the vicinity of the perimeter of the flat surface 2.

Next, as shown in FIG. 6, in a state where the flat surface 2 and the vicinity of the perimeter thereof are masked by the diffusion-mask thin film 5, the $n^+$ type diffusion layer 3 (depth of 0.4 to 0.5 μm) is formed by diffusing phosphorus (P), which is an n-type doping impurity, in the surface of the semiconductor element 1 by means of a known method, and a substantially spherical pn junction 4, which is located at a depth of about 0.4 to 0.5 μm from the surface of the semiconductor element 1, is thus formed.

During the phosphorus diffusion, the edge of the pn junction 4 diffuses below the diffusion-mask thin film 5 such that the concealed surface is protected, and the surface where the diffusion-mask thin film 5 does not remain is formed with a thin silicon oxide film (with a film thickness of about 0.4 μm, for example) containing phosphorus. The antireflection film 7 is therefore formed by leaving the silicon oxide film as is. Hence, the step of forming the antireflection film 7 can be omitted, which is advantageous. However, the thickness of the antireflection film may be adjusted to an optimum value by depositing silicon dioxide on the surface of the silicon oxide film by means of CVD. Thus, as shown in FIG. 6, a state is produced where the flat surface 2 of the semiconductor element 1 and the vicinity of the perimeter thereof are then covered by the diffusion-mask thin film 5 consisting of $SiO_2$ and the remaining part of the surface is covered by the antireflection film 7 consisting of phosphorus-containing $SiO_2$. Therefore, in order to form the antireflection film 7, the optical input can be raised by suppressing the reflection of light.

Next, as shown in FIG. 7, an aluminum paste 6A (with a diameter of 0.5 mm and a thickness of 0.2 to 0.3 mm, for example) is coated on the surface of the diffusion-mask thin film 5 of the flat surface 2 and a silver paste 6B (with a diameter of 0.5 mm and a thickness of 0.2 to 0.3 mm, for example) is coated on the apex on the opposite side facing the flat surface 2 with the center of the semiconductor element 1 interposed between the aluminum paste 6A and the silver paste 6B, and then these pastes 6A, 6B are dried by being heated to approximately 150° C. Thereafter, as detailed above, the multiplicity of semiconductor elements 1, which have each been provided with the aluminum paste 6A and the silver paste 6B as described above, are accommodated in the nitrogen gas atmosphere of an electric furnace so as to be heated and sintered for approximately 30 minutes at a temperature of approximately 800 to 850° C. Accordingly, as shown in FIG. 8, the positive electrode 6a is produced as a result of the aluminum paste 6A penetrating the diffusion-mask thin film 5 to make low resistance contact with the p-type silicon single crystal, and the negative electrode 6b is produced as a result of the silver paste 6B penetrating the antireflection film 7 to make low resistance contact with the diffusion layer 3, the positive electrode 6a and the negative electrode 6b being located substantially symmetrically such that the center of the semiconductor element 1 is interposed therebetween. A spherical or substantially spherical light receiving semiconductor device 10 that is suitable as a solar cell (light receiving device) is thus finished.

When the pastes are applied, the aluminum paste 6A may be coated on the flat surface 2 and hence the application position is not mistaken. The silver paste 6B may be applied at the apex on the opposite side to the aluminum paste 6A, and hence a mistake with the application position is not made.

As shown in FIGS. 20 to 27 of the International Patent Publication No. WO 98/15983, and its equivalent, U.S. Pat. No. 6,204,545, this spherical-surface light receiving-type semiconductor device 10 can be housed independently in a glass package or a synthetic resin package, or can be housed in a glass package or a synthetic resin package, as an array in which a plurality of semiconductor devices 10 is connected in series and is connected to an external circuit. The semiconductor device 10 can be put to practical use as a light receiving device (capable of receiving light from all directions) with barely any directivity.

Further, a flexible, sheet-like light receiving semiconductor module can also be produced by disposing semiconductor devices 10 in the form of a matrix with multiple rows and columns in which the multiplicity of semiconductor elements 1 of each column is electrically connected in series and the multiplicity of semiconductor elements 1 of each row is electrically connected in parallel, all these semiconductor devices 10 then being embedded in a transparent synthetic resin. Likewise, a cylindrical sheet-like or cylindrical rod-like light receiving semiconductor module can also be constituted. Further, as a structure in which a plurality of semiconductor elements 1 is electrically connected, a structure in which the plurality of semiconductor elements 1 is connected by means of an electrically conductive epoxy resin can also be adopted.

During the above electrode formation, by applying the aluminum paste 6A to the surface of the diffusion-mask thin film 5 and applying the silver paste 6B to the surface of the antireflection film 7 and then heating and sintering the pastes, the positive electrode 6a, which is connected to a p-type conductor, and a negative electrode 6b, which is connected to the diffusion layer 3, are formed. The method or process for the electrode formation can thus be simplified. Moreover, the silicon oxide film that is formed during the formation of the diffusion layer 3 is effectively put to practical use as the antireflection film 7, and hence the number of steps for fabricating the semiconductor device 10 can be small and the fabrication costs can be remarkably reduced.

Next, a description will be provided for the structure and the making method of a low-cost resin mold-type light receiving semiconductor module 20 (solar cell module) that is suitable to mass production by using the semiconductor device 10 which is a solar cell fabricated as above. First of all, the structure will be described with reference to FIGS. 16 and 17. This light receiving semiconductor module 20 is actually constituted mainly from the semiconductor devices 10 disposed in the form of a matrix with multiple rows and columns. However, in order to simplify the description, the same is provided by taking an example of a light receiving semiconductor module that uses twenty-five semiconductor devices 10 disposed in 5 rows and 5 columns, for example. The light receiving semiconductor module 20 comprises twenty-five semiconductor devices 10; a conductive connection mechanism 27 which comprises six connecting leads 21 to 26 and electrically connects the twenty-five semiconductor devices 10; a light transmitting member 28; and a positive terminal 29a and a negative terminal 29b.

The twenty-five granular semiconductor devices 10 are disposed in five rows and five columns in a state where the conduction direction is aligned to the direction of column, a plurality of semiconductor devices 10 of each column being electrically connected in series by the conductive connection mechanism 27 and a plurality of semiconductor devices 10 of each row being electrically connected in parallel. The conductive connection mechanism 27 is constituted by six metal connecting leads 21 to 26. The six connecting leads 21 to 26 comprise the connecting lead 21 connected to the positive electrodes 6a on the underside of the semiconductor devices 10 of the lowermost row; connecting leads 22 to 25, which are mounted between the semiconductor devices 10 of each row and the semiconductor devices 10 of the row adjoining the top face of the semiconductor devices 10 of each row; and the connecting lead 26 connected to the negative electrode 6b on the top face of the semiconductor devices 10 of the uppermost row. Each of the connecting leads 22 to 25 connects the negative electrodes 6b of a lower semiconductor devices 10 and the positive electrodes 6a of an upper semiconductor devices 10. Accordingly, the semiconductor devices 10 of each column are serially connected by the connecting leads 22 to 25, while the semiconductor devices 10 of each row are connected in parallel by the connecting leads 21 to 26.

Figure 18:
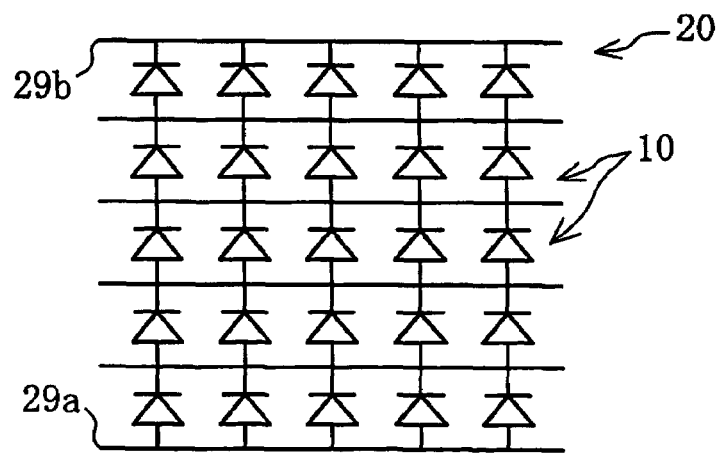

The twenty-five semiconductor devices 10 and the conductive connection mechanism 27 are packaged in an embedded state in a light transmitting member 28 consisting of a transparent synthetic resin such as an acrylic resin or polycarbonate, for example, a partial cylinder lens portion 28a that guides extrinsic light from both sides to the semiconductor devices 10 in each column being formed on the light transmitting member 28. An electrical circuit that is equivalent to the light receiving semiconductor module 20 constituting this solar cell panel is as shown in FIG. 18.

The structure is such that the light receiving semiconductor module 20 is embedded in the light transmitting member 28 consisting of a transparent synthetic resin, the twenty-five semiconductor devices 10 and the connecting leads 21 to 26 are rigidly packaged, and are superior in strength and durability. The partial cylinder lens portion 28a of the light transmitting member 28 serves to efficiently introduce extrinsic light into the semiconductor devices 10 of each column, and, in comparison with a case where the surface of the semiconductor module 20 is formed as a flat surface, possesses wide directivity and is superior in lighting and light-gathering. Moreover, the refractive index of the light of the light transmitting member 28 is greater than 1.0, and hence the light entering the light transmitting member 28 is repeatedly reflected at the surface of the partial cylinder lens portion 28a and is easily absorbed by the semiconductor devices 10. More particularly, the refractive index of glass and of a transparent synthetic resin such as acrylic or polycarbonate is greater than the refractive index of air, and therefore the incident light from the outside is diffused by the diffused reflection within the light transmitting member 28 and widely scattered. The semiconductor devices 10 housed within the light transmitting member 28 are capable of absorbing light in every direction, and hence exhibit high light usage efficiency in comparison with a solar cell panel with a conventional one-sided flat structure, and generate a large photovoltaic effect.

Because the semiconductor module 20 comprises the above-mentioned conductive connection mechanism 27, even when any semiconductor device 10 exhibits a functional loss or stops functioning due to failure or a shadow, because the output of a normal semiconductor device 10 is output by being shunted via another normal semiconductor devices 10 that are in a parallel connection, there is hardly any adverse effect caused by the failure or functional loss of some semiconductor devices 10, which makes the light receiving semiconductor module 20 superior in reliability and durability. Moreover, a plurality of semiconductor devices 10 can be connected in series and in parallel via a simple-structure conductive connection mechanism 27.

Next, a method for fabricating the above-described light receiving semiconductor module 20 (solar cell module) will be described with reference to FIGS. 9 to 15.

Figure 9:
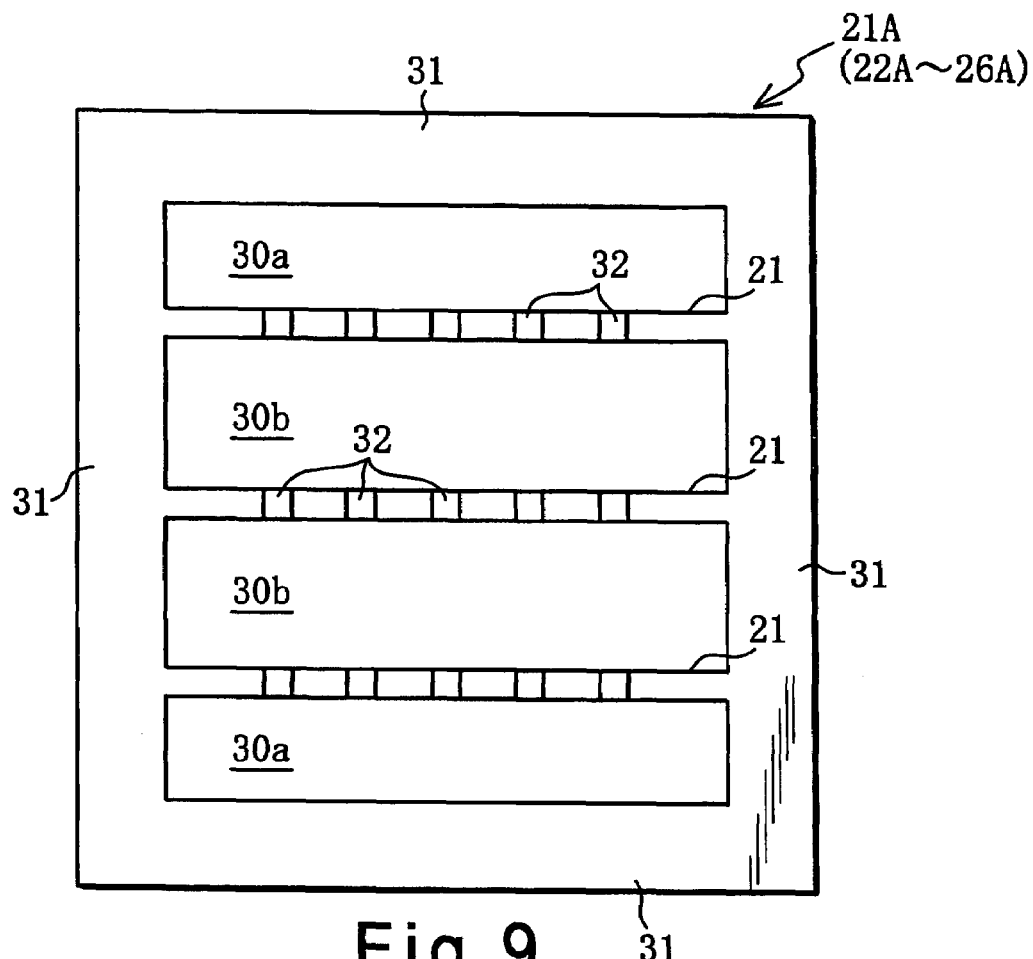

First of all, the above-mentioned multiplicity of semiconductor devices 10 is fabricated and, at the same time, as shown in FIG. 9, the surface of a thin plate (about 0.3 mm thick) of an iron-nickel alloy (Fe 56%, Ni 42%) is silver-plated or nickel-plated to a thickness of about 3 µm, and the thin plate is punched with a die, whereby the flat-plate-like lead frames 21A to 26A with four openings 30a and 30b are fabricated. An outer frame portion 31 with a width of about 4 mm and three mutually parallel connecting leads 21 that are 0.5 mm thick, for example, are formed in the lead frame 21A. The other lead frames 22A to 26A are also formed in this manner.

Next, as shown in FIGS. 9 to 13, an aluminum paste 32 (with a diameter of 0.5 mm, and a thickness of 0.2 to 0.3 mm) is printed at five points on the upper surface of the connecting leads 21 to 25 of the lead frames 21A to 25A respectively, and a silver paste 33 (with a diameter of 0.5 mm and a thickness of 0.2 to 0.3 mm) is printed at five points on the lower surface of the connecting leads 22 to 26 of the lead frames 22A to 26A respectively. Next, semiconductor devices 10 are placed, with keeping the positive electrodes 6a downward, on the aluminum paste 32 of the respective connecting leads 21 of the lead frames 21A. Next, the lead frame 22A is placed on the fifteen semiconductor devices 10 of the first row, and the fifteen negative electrodes 6b are caused to make contact with the silver paste 33 of the connecting lead 22. Thereafter, as described above, the lead frames 23A to 26A and semiconductor devices 10 are sequentially placed, and, the lead frames 21A to 26A are used to place 25×3 semiconductor devices 10 in the form of the 3 sets of 5×5 matrices shown in FIG. 13, whereby an assembly body 30 is made. Thereafter, in a state where a predetermined weight is placed on the uppermost-level lead frame 26A, the aluminum paste 32 and the silver paste 33 are cured by being housed within the heating oven and heated at a temperature of about 160 to 180° C.

Accordingly, the twenty-five semiconductor devices 10 of each set (each module) are electrically connected via the six lead frames 21A to 26A, so that a total of 75 semiconductor devices 10 of three sets are contained in an orderly fashion between the connecting leads 21 to 26 of the six lead frames 21A to 26A. The twenty-five semiconductor devices 10 of each module 20 thus assume a state where the semiconductor devices 10 of each column are electrically connected in series by the connecting leads 21 to 26 and where the semiconductor devices 10 of each row are electrically connected in parallel by the connecting leads 21 to 26.

Figure 14:
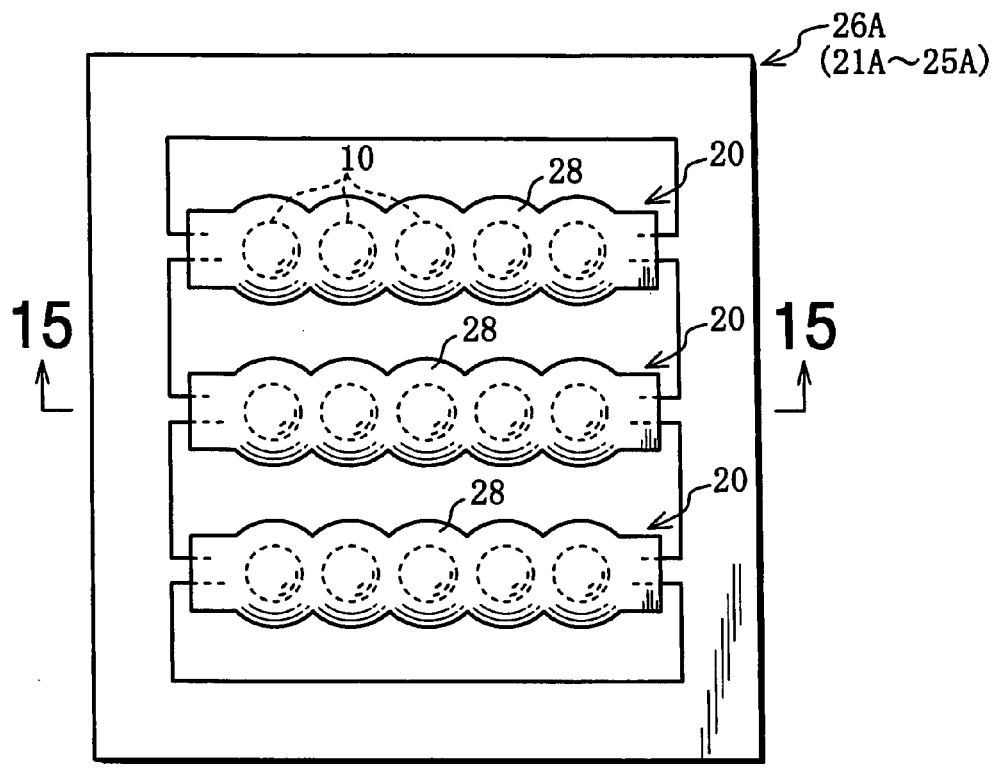
Figure 15:
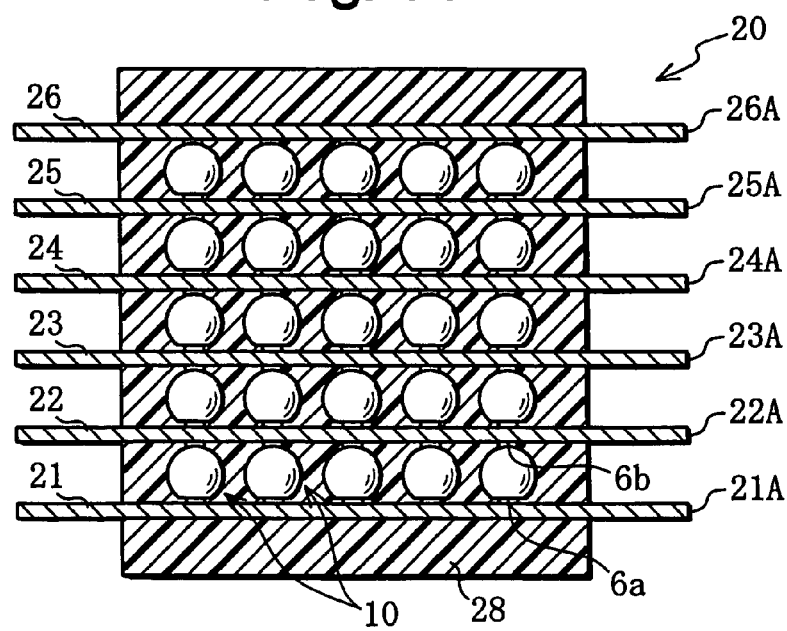

Next, as shown in FIGS. 14 to 15, the assembly body 30 of seventy-five semiconductor devices 10 and six lead frames 21A to 26A is housed within a mold (not illustrated) and molded as shown by using a transparent synthetic resin (such as acrylic resin or polycarbonate, for example). The semiconductor devices 10 in 5 rows and 5 columns of each set together with the corresponding connecting leads 21 to 26 are embedded within the light transmitting member 28 and packaged by the light transmitting member 28. Three sets of light receiving semiconductor modules 20 constituting solar cell panels are thus molded at the same time. A partial cylinder lens portion 28a, which focuses extrinsic light from both sides onto the semiconductor devices 10 in each column, is formed on the light transmitting member 28. Further, the two ends of the connecting leads 21 to 26 protrude to the outside of the light transmitting member 28.

Figure 16:
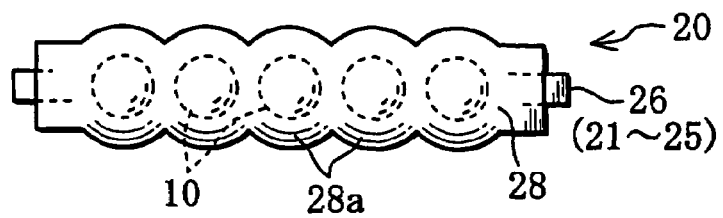
Figure 17:
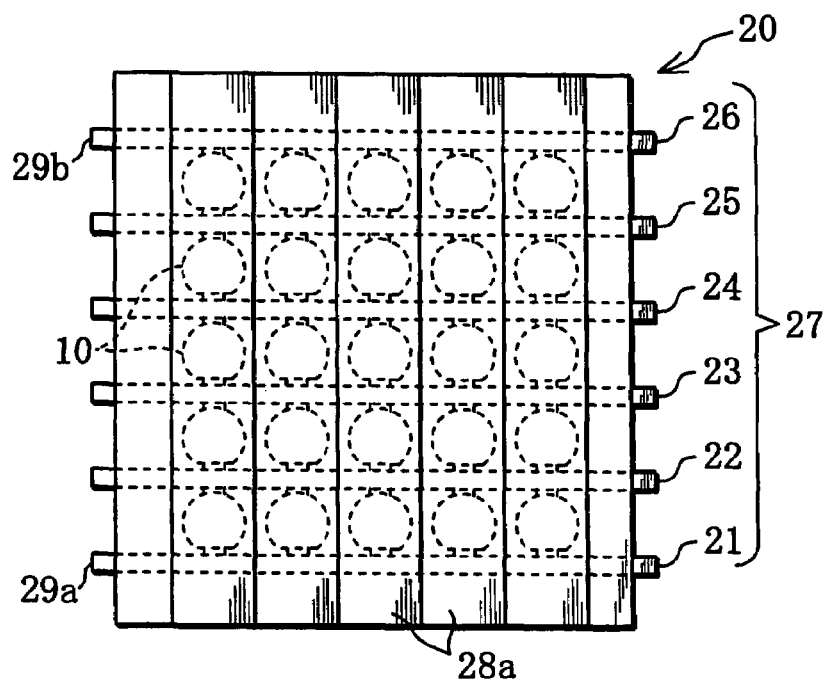

Finally, when the three sets of light receiving semiconductor modules 20 are decoupled from the outer frame 31 of the six lead frames 21A to 26A, the light receiving semiconductor modules 20 shown in FIGS. 16 and 17 are obtained.

First Modified Embodiment

Figure 10:
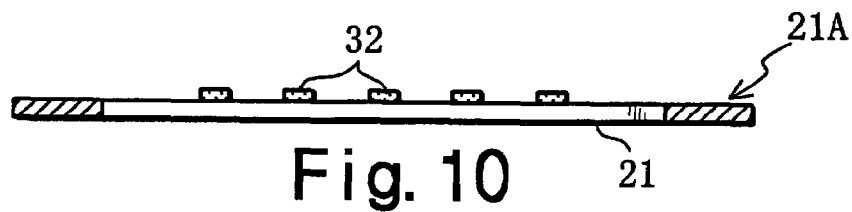
Figure 11:
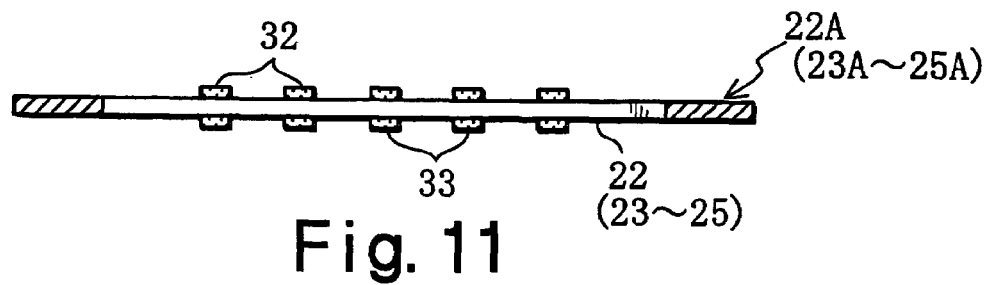
Figure 12:
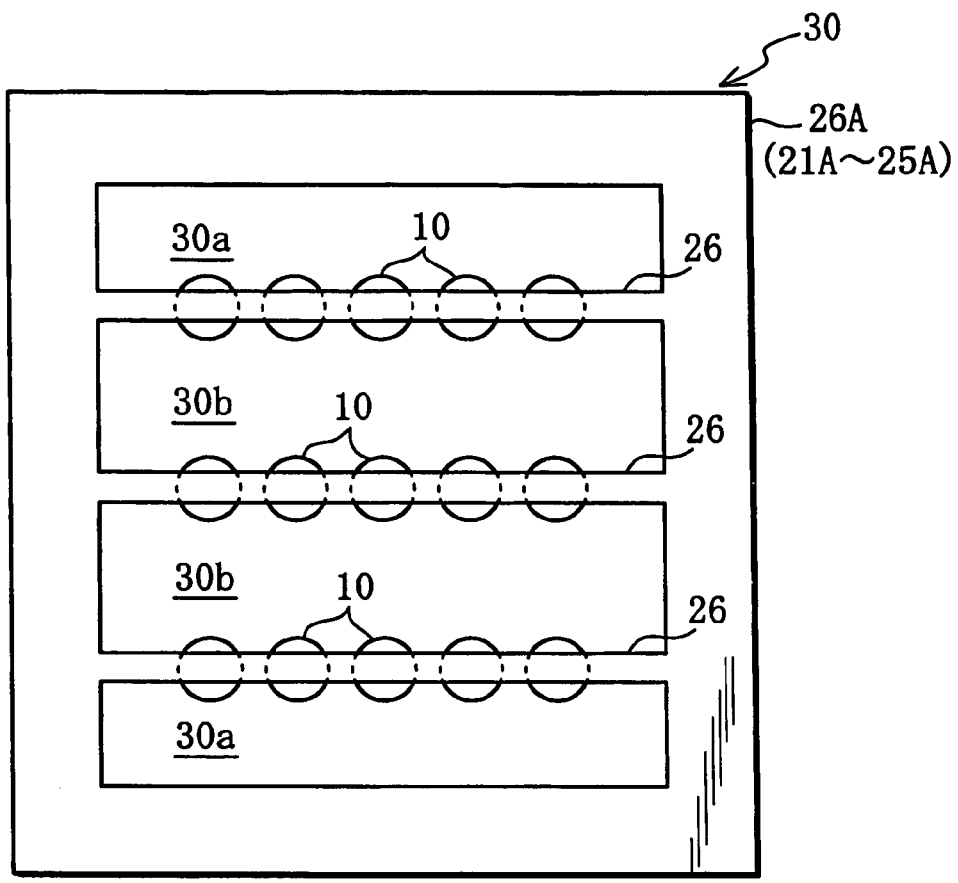

In this embodiment, a description is made for an example in which the assembly body 30 is assembled after the positive electrode 6a and the negative electrode 6b have been formed on each semiconductor device 10. However, as will be described next, the positive electrode 6a and the negative electrode 6b could also be formed during the assembly of the assembly body 30. That is, the aluminum paste 32 (with a diameter of 0.5 mm and a thickness of 0.2 to 0.3 mm) is printed as shown in FIG. 10 at five points on the upper surface of the connecting leads 21 to 25 of each of the lead frames 21A to 25A, and the flat surface 2 of the semiconductor device 10 not formed with electrodes is made to make surface contact atop the respective aluminum paste 32. In this state, the lead frames 21A to 25A together with the fifteen semiconductor devices 10 on the lead frames 21A to 25A are heated to 150° C. in a heating oven so as to cure the aluminum paste 32, whereby the semiconductor devices 10 are made to adhere to the connecting leads 21 to 25.

Next, silver paste 33 (with a diameter of 0.5 mm and a thickness of 0.2 to 0.3 mm) is applied to the respective apex (the apex opposite to the flat surface 2 such that the center of the semiconductor device 10 is interposed therebetween) of the fifteen semiconductor devices 10 stuck to the lead frames 21A to 25A, and the corresponding lead frames 22A to 26A atop the fifteen semiconductor devices 10 of the lead frames 21A to 25A respectively (the lead frames 22A to 25A to whose upper side the semiconductor devices 10 are stuck, and the lead frame 26A to which a semiconductor device 10 is not stuck) are placed with the two edges of the outline of the lead frames 22A to 26A serving as a reference. The connecting leads 22 to 26 are assembled in the assembly body 30 shown in FIG. 13 by being made to contact the silver paste 33. The assembly body 30 is then heated to 150° C. in a heating furnace to cure the silver paste and to stick the semiconductor devices 10 to the connecting leads 22 to 26.

Figure 13:
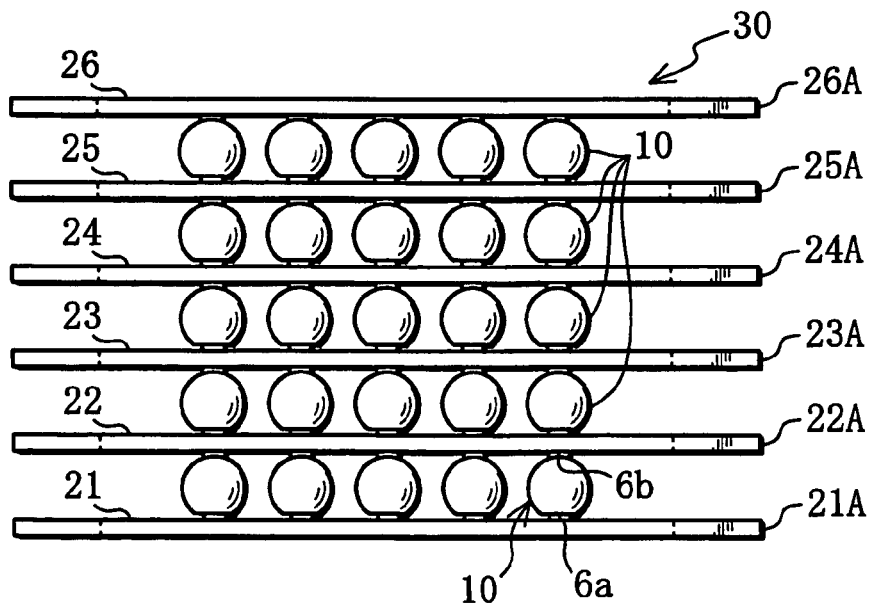

Next, the assembly body 30 is housed within the heating furnace and heated for approximately 30 minutes at a temperature of 800 to 850° C. in a nitrogen atmosphere. As a result of this heating, the diffusion-mask thin film 5 of each semiconductor device 10 is destroyed by the heat and the aluminum paste enters a state of being connected to the p-type silicon semiconductor, such that the aluminum paste forms the positive electrode 6a. At the same time, the antireflection film 7 of each semiconductor device 10 is destroyed by the heat and the silver paste enters a state of being connected to the n type diffusion layer 3, whereby the silver paste forms a negative electrode 6b. Accordingly, the assembly body 30 shown in FIG. 13 is then finished. With this method, the step of forming each semiconductor device 10 with the positive and negative electrodes 6a and 6b is omitted, it will be possible to form the electrodes 6a and 6b in parallel with the assembly of the assembly body 30. This is therefore advantageous on account of the reduction in the costs of fabricating the semiconductor module 20.

Second Modified Embodiment

Figure 19:
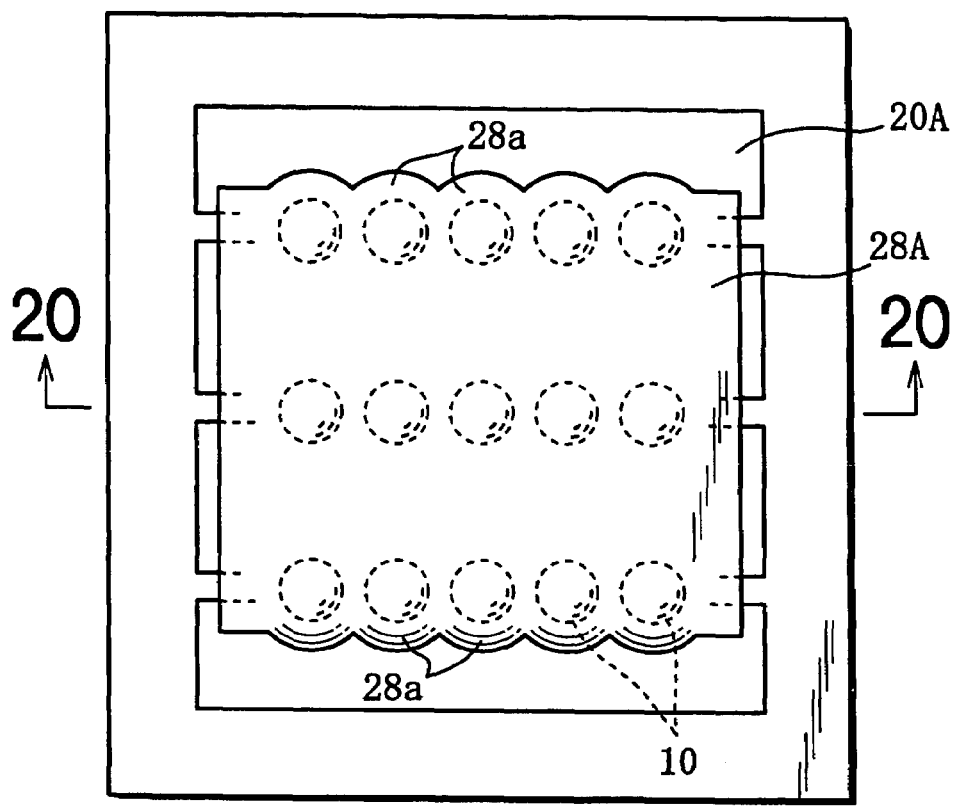
Figure 20:
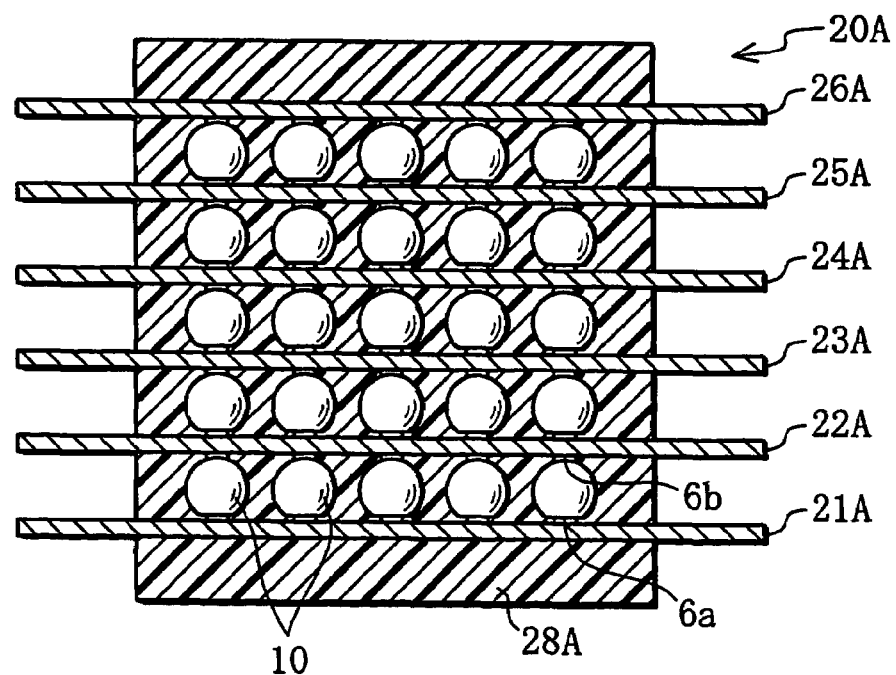

See FIGS. 19 and 20

In this embodiment, the assembly body 30 is housed within a mold and three sets' worth of semiconductor modules 20 are molded by pouring a transparent synthetic resin into the mold, whereupon each semiconductor module 20 is decoupled from the outer frame 31. However, three sets' worth of semiconductor modules 20 need not necessarily be molded in this manner. As shown in FIGS. 19 and 20, the twenty-five×three semiconductor devices 10 and the connecting leads 21 to 26 are housed within a mold with a cube-shaped mold cavity and a transparent synthetic resin is poured into the mold and solidifies such that a cube-shaped semiconductor module 20A in which the seventy-five semiconductor devices 10 are three-dimensionally housed in a substantially cube-shaped light transmitting member 28A may be molded. Further, a partial cylinder lens portion 28a like the above-mentioned partial cylinder lens portion 28a is desirably formed on the outside of the cube-shaped semiconductor module 20A. So too in the case of the semiconductor module 20A, although, in order to simplify the description, the same was made by taking, as an example, a case where the semiconductor devices 10 are arranged in a five row by five column matrix, there are also cases where the semiconductor devices 10 are arranged in the form of a matrix of multiple rows and multiple columns and this matrix is then molded to form the cube-shaped semiconductor module 20A.

In the case of the cube-shaped semiconductor module 20A, the multiple semiconductor devices 10 are arranged three-dimensionally in the light transmitting member 28A, and hence light from every direction within three dimensions is received and photoelectrically converted. Moreover, because this multiplicity of semiconductor devices 10 has a large surface area for receiving light, this multiplicity of semiconductor devices 10 possesses a light receiving capacity that is large in comparison with the semiconductor module 20. A portion of the light entering the light transmitting member 28A reaches directly to the serially connected semiconductor devices 10, while the remaining light reaches to the semiconductor devices 10 after repeatedly undergoing diffused reflection and scattering. For this reason, the light usage efficiency can be remarkably improved than a conventional solar cell panel. Further, the cube-shaped semiconductor module 20A can be constituted in the form of a sheet and a semiconductor module with a structure in which the semiconductor devices 10 are incorporated in a plurality of layers within a transparent and flexible light transmitting member can also be implemented.

Third Modified Embodiment

Figure 21:
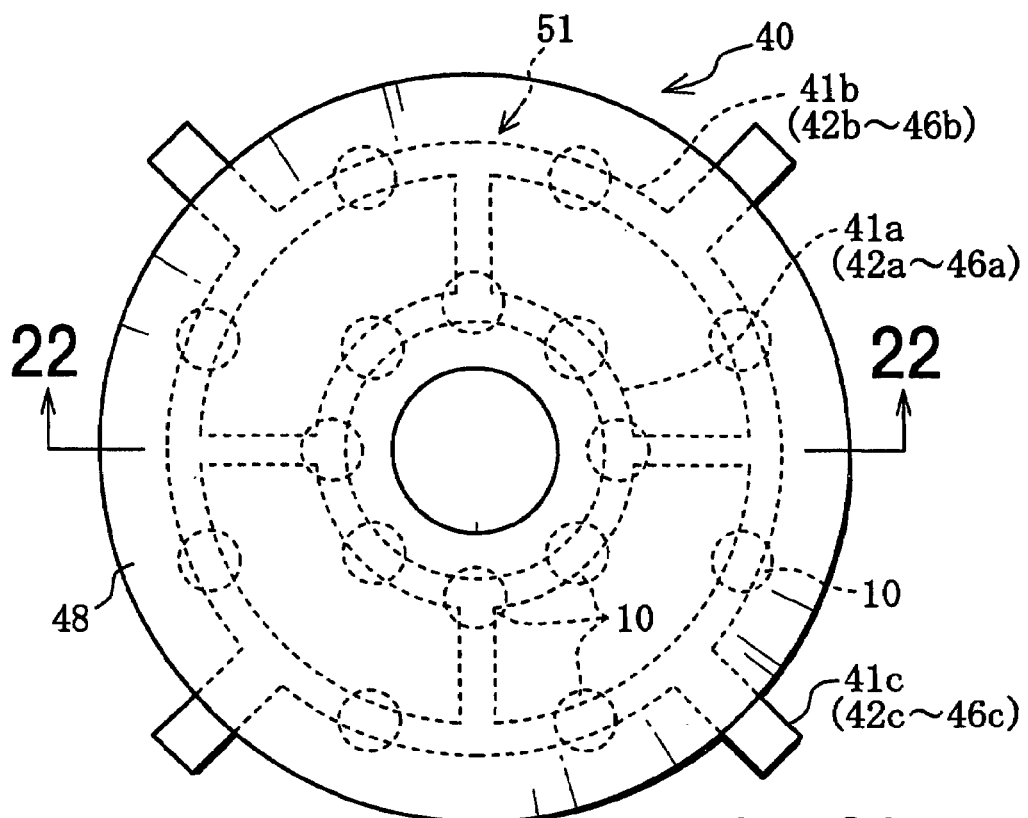
Figure 22:
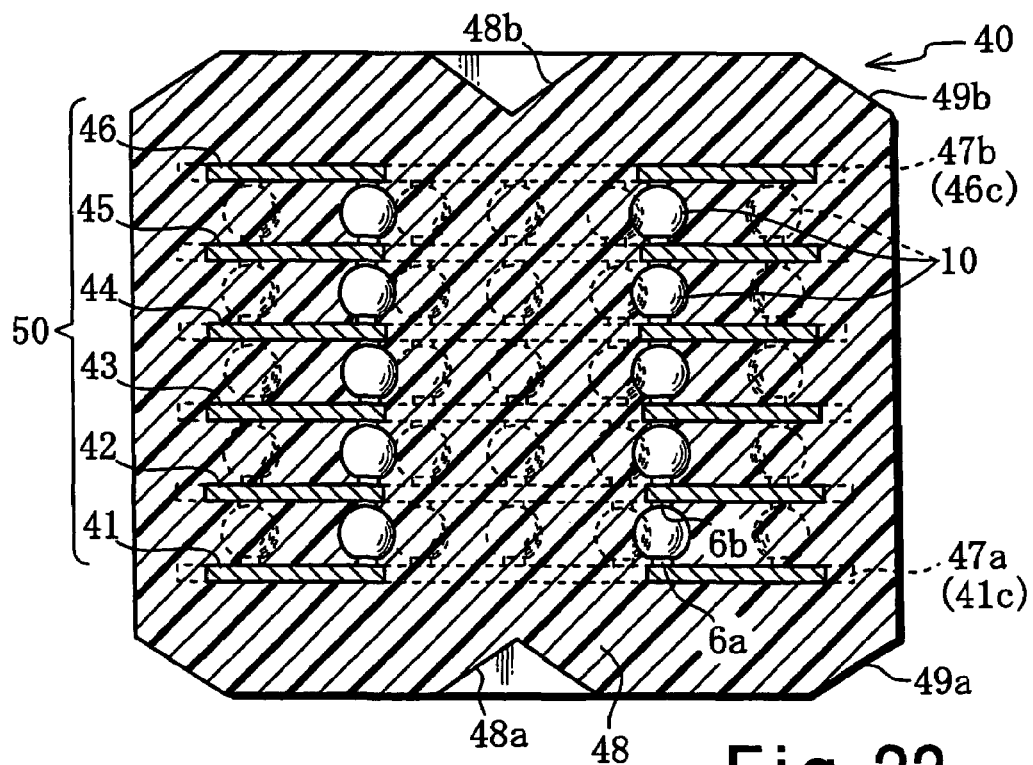

See FIGS. 21 and 22

Next, a description will be provided for a modified embodiment of the semiconductor module with a light receiving function that utilizes the semiconductor device 10. As shown in FIGS. 21 and 22, this semiconductor module 40 comprises eighty (16×5) semiconductor devices 10, for example, which function to perform an photoelectric conversion upon receiving light; a conduction mechanism 50, which comprises six metal circular lead frames 41 to 46; and a light transmitting member 48. However, the semiconductor devices 10 are the same as the semiconductor devices 10 of the semiconductor module 20.

The circular lead frames 41 to 46 are formed integrally with each of the inside connecting leads 41a to 46a and the outside connecting leads 41b to 46b, and four external leads 41c to 46c, which protrude toward the outside in the radial direction, are formed on the outside connecting leads 41b to 46b. Forty semiconductor devices 10 are connected to the inside connecting leads 41a to 46a (width 0.8 mm, for example) at equal intervals in the circumferential direction by being grouped into eight columns such that the conduction direction is uniform by aligned, and the remaining forty semiconductor devices 10 are connected to the outside connecting leads 41b to 46b (width 0.8 mm, for example) at equal intervals in the circumferential direction by being grouped into eight columns such that the conduction direction is uniform by aligned.

The conductive connection mechanism 50 comprises a lowermost-level circular lead frame 41, middle-level circular lead frames 42 to 45, and an uppermost-level circular lead frame 46. The circular lead frames 41 to 46 are of the same plate thickness and same quality as the lead frames (21 to 26) of the above embodiments. An external lead 41c of the lowermost-level circular lead frame 41 is a positive electrode terminal 47a and an external lead 46c of the uppermost-level circular lead frame 46 is a negative electrode terminal 47b.

Similarly to the semiconductor module 20, each of the circular lead frames 41 to 45 is connected by aluminum paste to the positive electrode 6a of an upper semiconductor device 10, and each of the circular lead frames 42 to 46 is connected by silver paste to the negative electrodes 6b of a lower semiconductor devices 10. Accordingly, the conductive connection mechanism 50 is such that five semiconductor devices 10 of each column are electrically connected in series, and sixteen semiconductor devices 10 of each level are electrically connected in parallel.

An assembly body 51, which is produced by assembling the six circular lead frames 41 to 46 and eighty semiconductor devices 10, is embedded within the cylindrical light transmitting member 48. However, the outer ends of the external leads 41c to 46c protrude to the outside. The light transmitting member 48 consists of a transparent synthetic resin such as acrylic or polycarbonate. Conical recesses 48a and 48b, which serve to raise the light introduction rate, are formed in the middle of the lower and upper end faces of the light transmitting member 48. Partial conical chamfered sections 49a and 49b, which serve to raise the light introduction rate, are formed on the respective outer circumference of the lower and upper ends of the light transmitting member 48.

The method of fabricating this semiconductor module 40 will now be described. First of all, the circular lead frames 41 to 46 and the eighty semiconductor devices 10 are fabricated and prepared. Next, substantially the same manner as the semiconductor module 20 was adopted, the assembly body 51 is assembled by assembling the circular lead frames 41 to 46, the eighty semiconductor devices 10, and the aluminum paste and silver paste, and so forth.

Next, the aluminum paste and silver paste are cured by housing the assembly body 51 in a heating oven and subjecting the assembly body 51 to a heat treatment for approximately 30 minutes at a temperature of 800 to 850° C. in a nitrogen atmosphere. Next, the assembly body 51 is housed in a mold, and, when a dissolved transparent synthetic resin (acrylic resin or polycarbonate, for example) is poured into the mold and solidifies, the semiconductor module 40 is obtained.

Further, as per the first modified embodiment, so too when the semiconductor module 40 is fabricated, the positive and negative electrodes 6a and 6b may be formed in parallel with the assembly of an assembly body 60 by using semiconductor devices 10 with no electrode, or may be formed after assembling the assembly body 60.

Because the semiconductor module 40 is formed so as to have a cylindrical shape as a whole, even in a case where the extrinsic light comes from any direction within the 360 degrees of the full circumference, this light is reliably introduced to the light transmitting member 48, and the extrinsic light from above or below the semiconductor module 40, is also reliably introduced to the light transmitting member 48. The light thus introduced into the light transmitting member 48 is scattered via diffused reflection while being photoelectrically converted upon reaching the semiconductor device 10, thereby generating an electromotive force on the order of approximately 3.0 volts between the positive electrode terminal 47a and the negative electrode terminal 47b.

Fourth Modified Embodiment

See FIGS. 23 to 29

Figure 23:
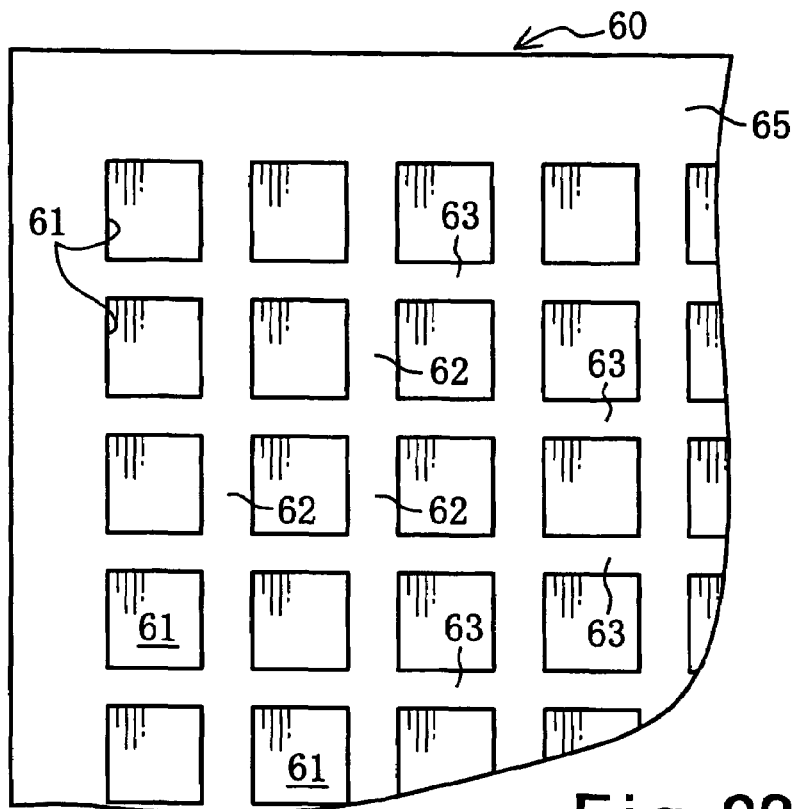

A modified embodiment of the light receiving semiconductor module will now be described along with the making method and structure thereof. First of all, the base sheet 60 shown in FIG. 23 is fabricated. The base sheet 60 is a flat-plate-like transparent sheet of a predetermined size (200 mm×200 mm, for example) made of a transparent synthetic resin (acrylic or polycarbonate, for example) with a thickness of 0.4 to 0.6 mm. Square small holes 61 with the dimensions 1.5 mm×1.5 mm, for example, which serve to mount semiconductor devices 10 like those of the semiconductor device 10 in FIG. 8, are formed in the form of a matrix with multiple rows and multiple columns, vertical frames 62 with a width of 0.8 to 1.0 mm being formed between one column of small holes and the next column, and connecting lead formation sections 63 with a width of 0.4 to 0.6 mm being formed between one row of small holes and the next row. The small holes 61 are desirably formed having a size and shape such that a plurality of points on the equator midway between the positive and negative electrodes 6a and 6b of the semiconductor devices 10 make light point contact and are trapped. The shape of the small holes is not restricted to a square. Rather, a variety of shapes can be adopted.

The base sheet 60 can be fabricated by means of extrusion molding or similar by using a precise molding die, but could also be fabricated by boring with a laser beam of an excimer laser in a state where predetermined masking is performed on a sheet-like or film-like base sheet member, or may be fabricated by means of another method.

Figure 24:
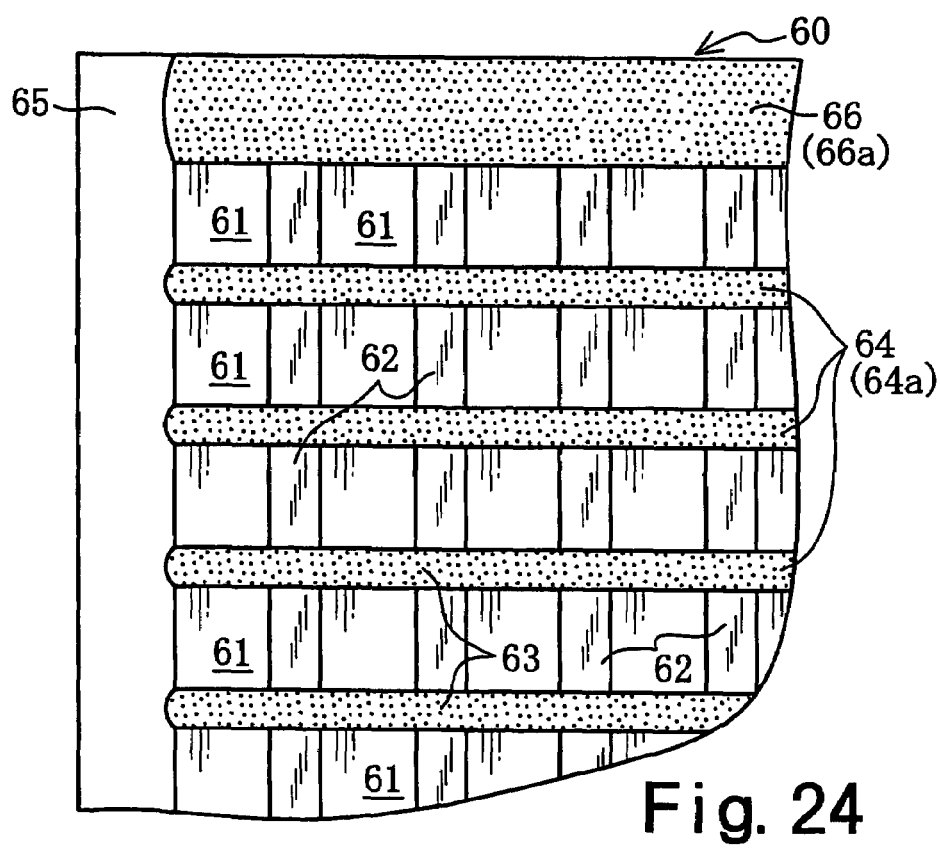

Next, as shown in FIG. 24, at least a single side of the multiple connecting lead formation section 63 and sections facing the small holes 61 are formed with a transparent conductive synthetic resin or a metal conductive film 64a (with a thickness of 10 to 30 μm, for example), whereby the connecting lead 64 is produced. A conductive synthetic resin or a metal conductive film 66a (with a thickness of 10 to 30 μm, for example) is formed at one end of the base sheet 60 in the column direction thereof and on the external conductive wire connection portion 65 at the other end, and the conductive film 66a is formed in the section facing the small holes 61, whereby a connecting lead 66 is produced. Further, when the metal conductive films 64a and 66a are formed, the same may be formed by a nickel plating film, for example. In addition, a multiplicity of semiconductor devices 10 like those shown in FIG. 8 is fabricated prior to or in parallel with the fabrication of the base sheet 60.

Figure 25:
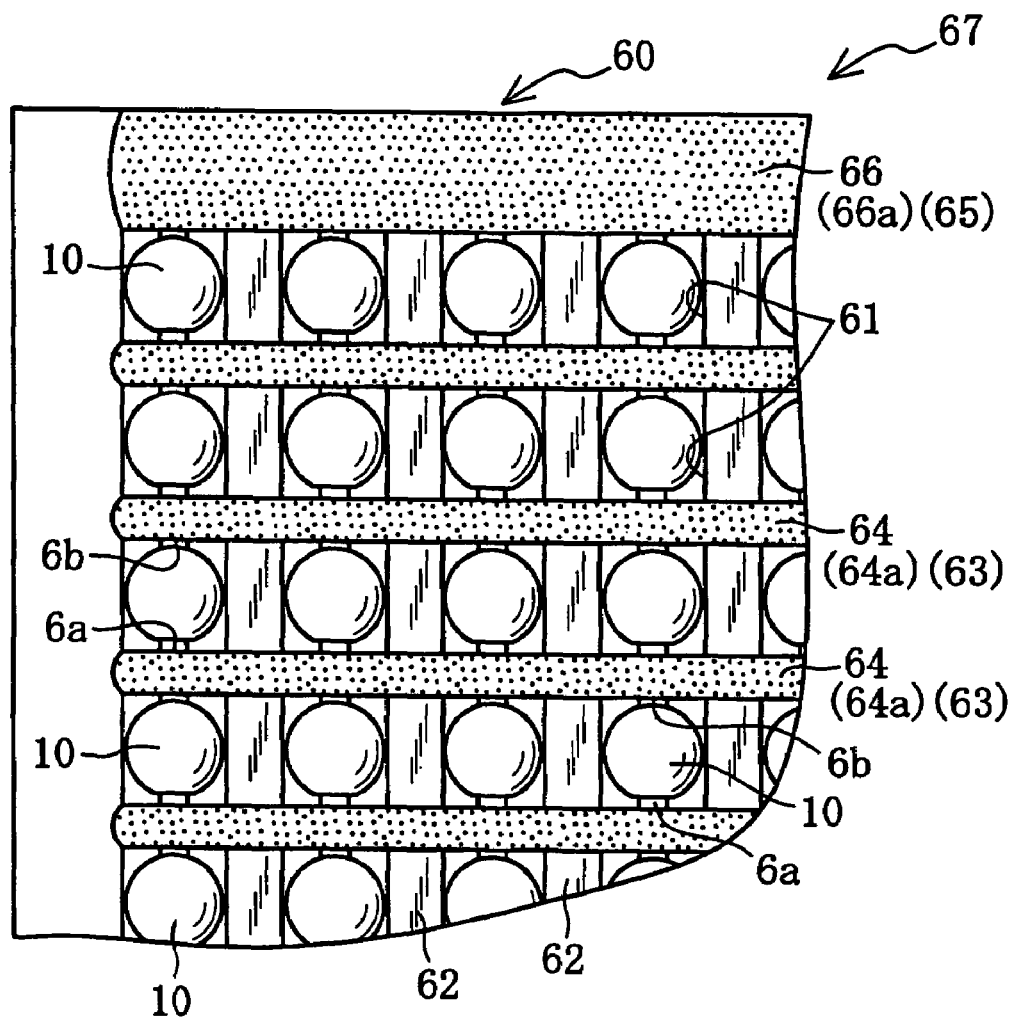
Figure 26:
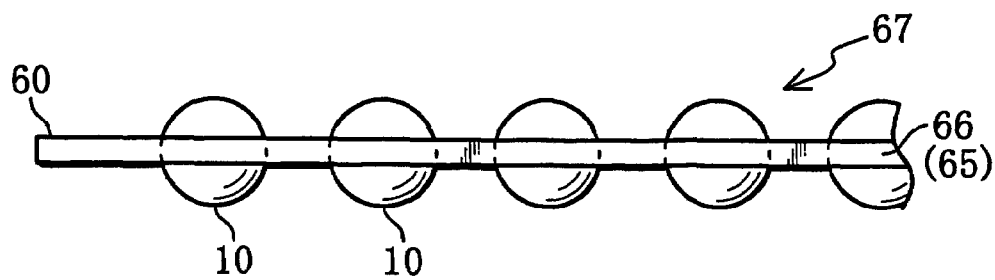

Next, as shown in FIGS. 25 and 26, a semiconductor device 10 is mounted in each of a multiplicity of small holes 61 in a state where the base sheet 60 is set in a state of floating approximately 0.5 mm above a suitable horizontal base plate. In this case, a conductive adhesive or conductive paste (aluminum paste, silver paste, gold paste, or the like) is applied to the positive electrode 6a and the negative electrode 6b of the semiconductor device 10, and the semiconductor device 10 is mounted in the small hole 61 in a state where the respective conduction directions of all the semiconductor devices 10 are uniform and where the positive and negative electrodes 6a and 6b make surface contact with the corresponding conductive films 64a and 66a, the semiconductor device 10 being made to protrude substantially equally outside both sides of the base sheet 60. Thereafter, where required, the conductive adhesive and conductive paste on the electrodes 6a and 6b may be cured by being irradiated with laser light.

A conductive connection mechanism that comprises a multiplicity of connecting leads 64 and 66, and a conductive paste, or the like, which connects the electrodes 6a and 6b of the semiconductor device 10 to the connecting leads, is constituted. As a result of this conductive connection mechanism, semiconductor devices 10 of each column are connected in series and semiconductor devices 10 of each row are connected in parallel.

Figure 27:
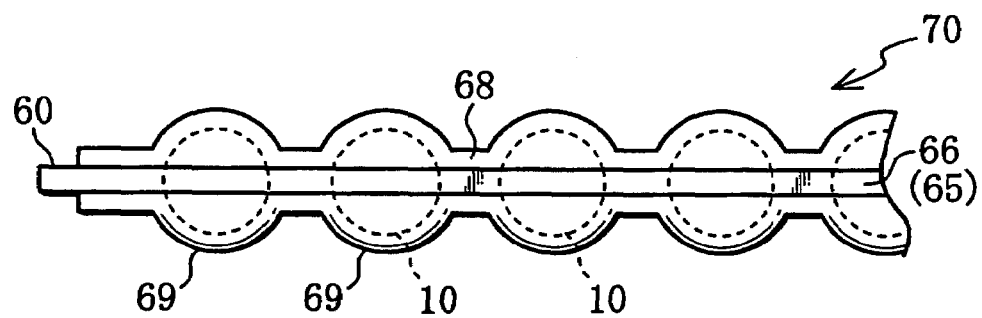

Next, as shown in FIG. 27, an assembly body 67, in which the base sheet 60 and a multiplicity of semiconductor devices 10 are assembled, is housed within a predetermined mold, and, when molding is performed by pouring a dissolved transparent synthetic resin (acrylic, polycarbonate, or the like, for example) into the mold, the base sheet 60 and the multiplicity of semiconductor devices 10 are embedded within a light transmitting member 68 consisting of a synthetic resin, whereby a substantially transparent sheet- or film-like semiconductor module 70 is obtained. Further, for an external conductive wire connection, part of an external conductive wire connection portion 65 at both ends of the base sheet 60 is molded in a state of protruding from the light transmitting member 68.

The average film thickness of the synthetic resin applied during this molding may be 0.5 to 1.0 mm, for example, but is not limited to this film thickness. Rather, the film thickness can be determined freely. As for the synthetic resin provided in the molding process, a synthetic resin of the same type as the base sheet 60 is desirably adopted. However, a different type of synthetic resin may also be adopted, and, by suitably selecting the synthetic resin provided in this molding, a flexible semiconductor module 70 can also be rendered. Further, when a conductive paste is adopted for the positive and negative electrodes 6a and 6b of the semiconductor device 10, curing of the conductive paste can also be achieved by means of the heat of the synthetic resin injected during molding.

In the case of the semiconductor module 70, in order to raise the light introduction capacity (lighting-gathering capacity), molding is performed such that the outside part corresponding with the semiconductor devices 10 of each column is a partial cylinder face 69. The partial cylinder face 69 may be formed only on one side, while the other side may be formed as a flat surface. Further, molding may be performed such that the outside part that corresponds with each semiconductor device 10 of the semiconductor module 70 is a partial-sphere surface. The partial-sphere surface may be formed on only one side, while the other side may be formed as a flat surface.

Figure 28:
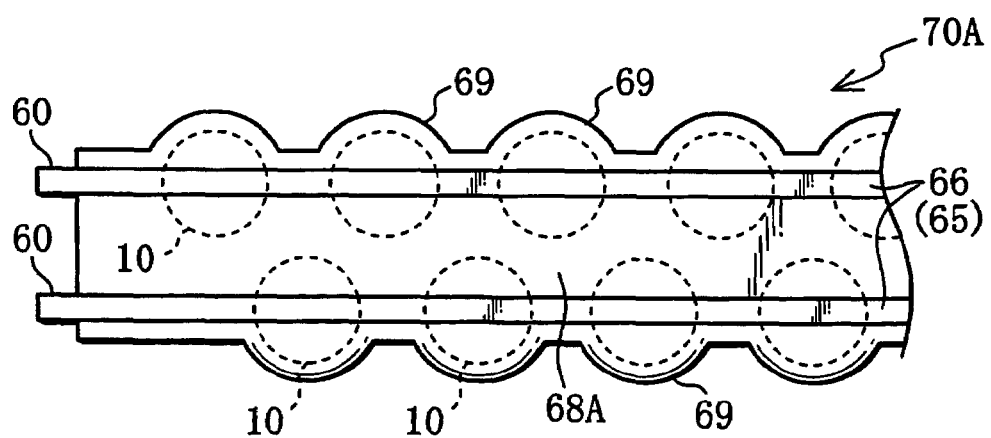

Here, as shown in FIG. 28, two assembly bodies 67 are placed close together parallel to each other by being shifted by a half pitch in the row direction and/or column direction. In this state, the assembly bodies 67 are housed in a mold as described above, and, when a light transmitting member 68A is formed as a result of the assembly bodies 67 being integrally molded by using a transparent synthetic resin, a semiconductor module 70A is obtained. Further, in the case of the semiconductor modules 70 and 70A, an optical reflection film such as a nickel plating film may be formed on the outside on the opposite side to the entering direction of the incident light.

According to the semiconductor modules 70 and 70A of this embodiment, in addition to actions and effects like those of the semiconductor modules 20, 20A, 40, being obtained, specific actions and effects are also obtained. The semiconductor modules 70 and 70A are fabricated in sheet form by forming connecting leads 64 and 66 on the base sheet 60, which can be fabricated at low cost, mounting a multiplicity of semiconductor devices 10, and then forming synthetic-resin light transmitting members 68 and 68A by means of injection molding and so forth. Hence, a sheet-like or film-like lightweight semiconductor module is produced, fabrication costs can be reduced, and a high output or high voltage photovoltaic effect can be generated by means of a multiplicity of semiconductor devices 10.

The semiconductor modules 70 and 70A can also be fabricated with a thickness of 2.0 to 3.0 mm, and a solar cell panel (solar cell sheet) that can be stuck on window glass can also be implemented. Moreover, flexible semiconductor modules 70 and 70A can also be constituted, it will be possible to fabricate semiconductor modules 70 and 70A that can be applied to a variety of applications such as a semiconductor module that can be mounted on the body surface of an automobile.

More particularly, where the semiconductor module 70A is concerned, because semiconductor devices arranged in a matrix shape are incorporated in a two-layer structure, light entered in the light transmitting member 68A is easily absorbed by the semiconductor device 10, thereby raising the light usage efficiency.

Figure 29:
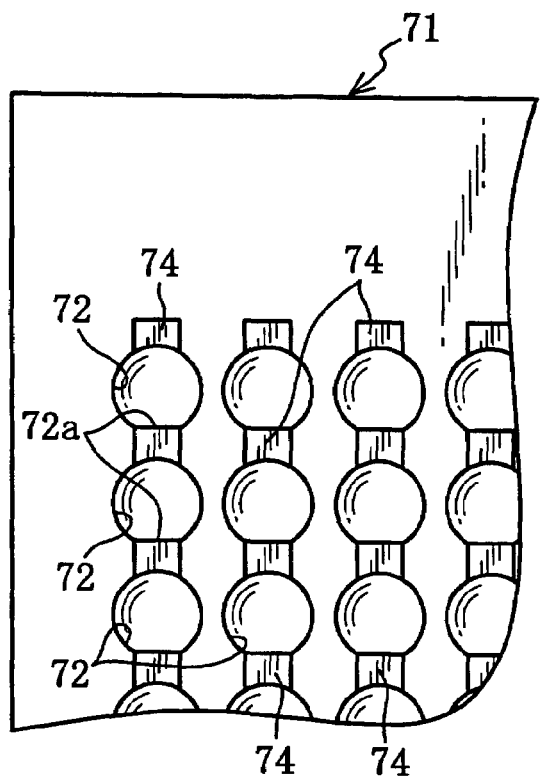
Figure 30:
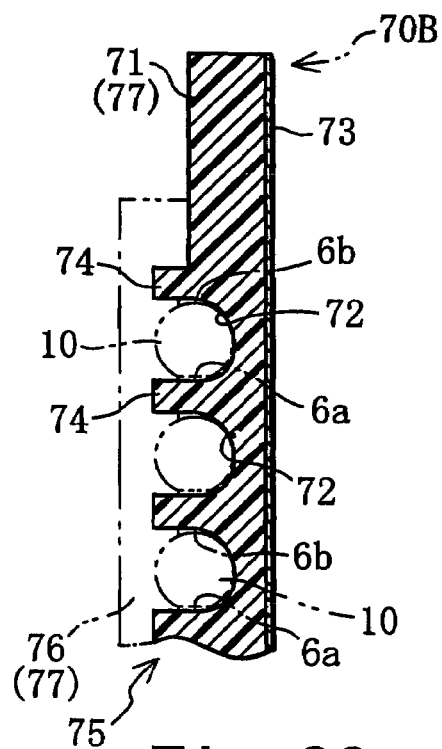

Next, an example in which this modified embodiment is modified in part will be described simply on the basis of FIGS. 29 and 30. As shown in FIGS. 29 and 30, a multiplicity of substantially semispherical small recesses 72 are formed in the form of a matrix with multiple rows and multiple columns on a base sheet 71 (with a thickness of 1.5 to 2.0 mm, for example) made of a transparent synthetic resin such as acrylic or polycarbonate, for example. An optical reflection film 73 such as a nickel plating film, for example, may be formed, on the rear side of the base sheet 71. But the optical reflection film 73 may be omitted. Further, the base sheet 71 may be constituted by a soft transparent synthetic resin material.

The small recesses 72 are formed such that half of the semiconductor devices 10 on the one side can be fitted at a minute gap or without a gap, and are formed with a flat section 72a that conforms with the shape of the flat surface 2 of the semiconductor device 10. Further, retaining portions 74, which serve to provide a hold, by way of surface contact with the positive and negative electrodes 6a and 6b, are formed so as to protrude upright approximately 0.4 mm to the front side of the page of FIG. 29, at both ends of the small recesses 72 in the column direction thereof. Multiple row connecting leads with the same structure as the connecting leads 64 and 66 are formed on the base sheet 71 and the semiconductor devices 10 are mounted in each of the small recesses 72, such that the positive electrodes 6a and negative electrodes 6b are connected to corresponding connecting leads so as to be capable of conducting electricity thereto, and are fixed firmly. Here, the constitution may be such that the retaining force of the retaining portions 74 is used to retain the semiconductor devices 10. Further, in order to facilitate the formation of the connecting leads, the retaining portions 74 of each row may be formed continuously. Similarly to the connecting leads 64 and 66, the connecting leads formed in multiple rows constitute a conductive connection mechanism whereby the multiplicity of semiconductor devices 10 of each column are connected in series and the semiconductor devices 10 of each row are connected in parallel.

Next, an assembly body 75 that is produced by mounting a multiplicity of semiconductor devices 10 on the base sheet 71, is housed in a predetermined mold and molding is performed by pouring a transparent synthetic resin into the mold. A transparent and soft synthetic resin material may be used as the synthetic resin provided in this molding. Accordingly, a multiplicity of semiconductor devices 10 become a state of being embedded in a light transmitting member 77 that consists of the base sheet 71 and a synthetic resin 76 that is poured into the mold and solidifies. A lightweight, light receiving semiconductor module 70B (solar cell sheet, solar cell film, or solar cell panel) that is in the form of a sheet or film is thus obtained. Further, a partial cylinder surface that is similar to the partial cylinder face 69, or a partial-sphere surface, or the like, may be formed in the outer surface of the light transmitting member (76) that is formed by the molding. With the semiconductor module 70B, actions and effects like those of the semiconductor modules 70 and 70A are obtained.

Fifth Modified Embodiment

FIGS. 31 to 34

Figure 33:
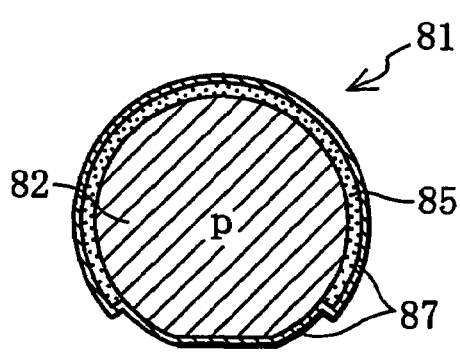
Figure 34:
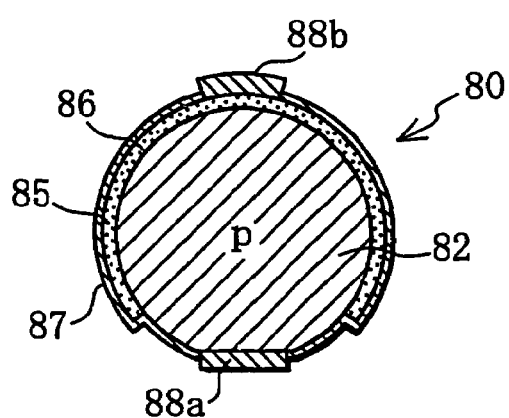

FIG. 34 is a cross-sectional view of a semiconductor device 80 constituting a spherical light receiving cell. The fabrication method and structure of the semiconductor device 80 will now be described on the basis of FIGS. 31 to 34.

Figure 31:
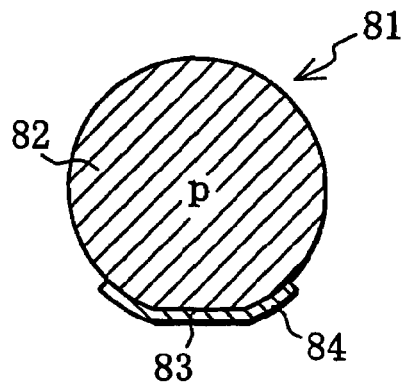

The semiconductor element 81 shown in FIG. 31 is the same as the semiconductor element 1 shown in FIG. 5. One flat surface 83 is formed on a spherical p-type silicon single crystal 82, and, before a thin-film $n^+$ silicon growth layer 85 is grown on the surface of the silicon single crystal 82, a mask thin film 84 (silicon oxide film), which serves as a mask during the growth of the thin-film single crystal, is formed in the same manner as in the above embodiment on the flat surface 83 and in the vicinity thereof. Further, where required, a silicon nitride film ($Si_3N_4$) may be formed on the outside of the mask thin film 84.

Figure 32:
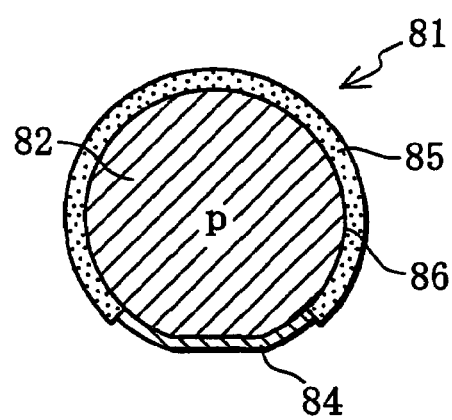

Next, as shown in FIG. 32, an $n^+$ type growth layer 85 (this is equivalent to a semiconductor thin-film deposition layer) with a uniform film thickness (for example, 0.5 to 1.5 μm) is grown on the surface of the externally exposed p-type silicon single crystal 82 by using hot-wall type atmospheric pressure Chemical Vapor Deposition (CVD) in which the source gases are known dichlorosilane ($SiH_2Cl_2$) and monosilane ($SiH_4$), for example. Accordingly, a spherical pn junction 86 is formed at the surface of the p-type silicon single crystal 82. Next, the mask thin film 84 is removed by using a known etching method and then the whole surface is lightly etched (with a thickness of 0.1 to 0.2 μm, for example). Thereafter, a silicon oxide film with a thickness of 0.4 to 0.5 μm is once again deposited (formed) and, as shown in FIG. 33, a substantially spherical antireflection film 87 is formed.

In addition to a silicon oxide film, a thin film of titanium oxide, silicon nitride, aluminum oxide or magnesium fluoride, or the like, can also be adopted as the antireflection film 87.

Next, similar to the above embodiments, a positive electrode 88a and a negative electrode 88b are formed in the middle of the flat surface 83 and at the apex of the spherical surface facing the flat surface 83 respectively, such that the center of the semiconductor element 81 is interposed therebetween. This semiconductor device 80 (a spherical-surface light receiving cell) also affords substantially the same photoelectric conversion function as the semiconductor device 10 in FIG. 8, and possesses wide directivity.

Sixth Modified Embodiment

See FIGS. 35 to 38

Figure 37:
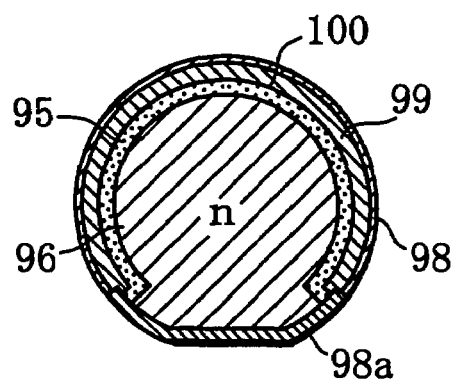
Figure 38:
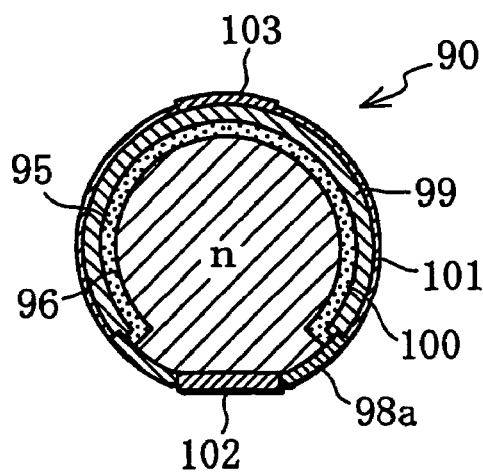

FIG. 38 is a cross-sectional view of an npn phototransistor 90 (semiconductor device) that has a substantially spherical light receiving surface. A description of the making method and structure of this npn phototransistor 90 will now be made on the basis of FIGS. 35 to 38.

Figure 35:
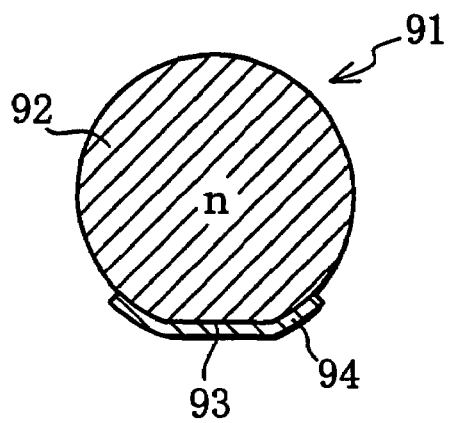
Figure 36:
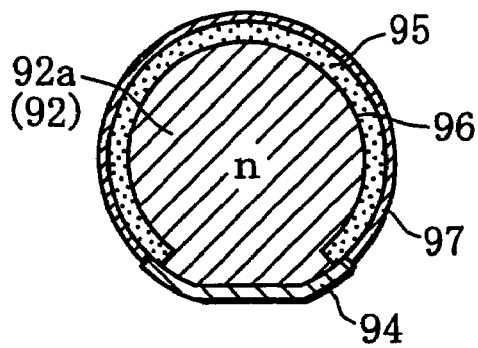

The semiconductor element 91 shown in FIG. 35 is an element produced by forming a flat surface 93 at one apex of the spherical n-type silicon single crystal 92 (resistivity 1 to 10 Ωcm), and then forming a boron diffusion mask thin film 94 (silicon oxide film) on the flat surface 93 and in the vicinity thereof The semiconductor element 91 differs only in that the n-type silicon single crystal 92 is applied in place of the p-type silicon single crystal in FIG. 5 of the above embodiment, and can therefore be fabricated in substantially the same manner as the semiconductor element 1 in FIG. 5.

Next, a p-type base layer 95 is formed on the surface of the n-type silicon single crystal 92 by diffusing boron (to a depth of 0.3 to 0.5 μm, for example), which constitutes the p-type impurity, by known thermal diffusion. Accordingly, a substantially spherical collector junction 96 is formed between the p-type base layer 95 and an n-type collector 92a consisting of the n-type silicon single crystal 92. A thin silicon oxide film 97, which is generated when the boron is diffused, is removed by means of a known etching technique together with the diffusion mask thin film 94. Thereafter, as shown in FIG. 37, silicon oxide films 98 and 98a are provided once again over the whole surface. In order to use silicon oxide film 98 as a mask for the phosphorus diffusion on top of the surface of the p-type base layer 95, and the silicon oxide film 98 is removed by a known photoetching technique, leaving the silicon oxide film 98a on the flat surface 93 and in the vicinity thereof. Further, the flat surface 93 can be used to align the part to be masked.

Next, a substantially spherical n-type emitter layer 99 is formed in the region of the p-type base layer 95 by diffusing phosphorus (to a depth of 0.1 to 0.2 μm, for example) which constitutes the n-type impurity by means of known thermal diffusion technique. Accordingly, as shown in FIG. 37, an emitter junction 100, which keeps a fixed interval (for example, 0.1 to 0.4 μm) from the collector junction 96, is formed between the n-type emitter layer 99 and the p-type base layer 95. The thin silicon oxide film generated during the phosphorus diffusion is used as an antireflection film 101. Next, a collector electrode 102 and an emitter electrode 103 are provided as shown in FIG. 38 by using a silver paste and an aluminum paste as used for the semiconductor element 1 of the above embodiments. The electrodes 102 and 103 may be formed so as to be usable as a junction with an external electrically conductive member such as a lead frame.

The substantially spherical npn phototransistor 90 (equivalent to a light receiving semiconductor device) has a spherical surface of which the majority is a light receiving surface, such that when incident light from outside is absorbed in the vicinity of the collector junction 96 in a state of reverse bias, an optical current is generated and an amplified external current flows between the emitter electrode 103 and the collector electrode 102. This phototransistor 90 can be used as an optical switch or the like and has characteristics such as high light receiving sensitivity and wide light directivity.

Next, descriptions will be made for various modified embodiments partially modifying the above embodiments.

1) A silicon polycrystal can also be adopted as the semiconductor constituting the semiconductor elements 1, 81, 91, or, instead of silicon, another semiconductor, such as an Si and Ge mixed-crystal semiconductor, or a multilayered structure semiconductor may be adopted, for example. Any compound semiconductor such as GaAs, InP, GaP, GaN, InCuSe, or SiC may be adopted and another semiconductor may be applicable.

2) The diameter of the semiconductor crystal forming the semiconductor element 1 is not limited to 1.5 mm. Rather, there are also cases where the diameter has a magnitude on the order of 0.5 to 3.0 mm. Further, the conductivity type of the semiconductor crystal forming the semiconductor element 1 is not restricted to the p-type. The n-type is also acceptable, in which case a p-type diffusion layer is formed.

3) The diffusion layer 3 and the pn junction 4 can also be formed by using another semiconductor thin-film deposition method such as Chemical Vapor Deposition.

4) The antireflection film 7 may be constituted by another insulating film such as a titanium oxide film or a silicon nitride film, in place of a silicon oxide film.

5) Either one or both of the electrodes 6a and 6b can be formed by using any electrode material such as gold, silver, copper, aluminum, antimony, an alloy of antimony and gold, gallium, an alloy of gallium and silver, and an alloy of gallium and gold, and by using a paste of such material.

6) In place of the light transmitting member of the semiconductor module 20 and 20A, a structure, which is formed by mounting reinforced glass plates on both sides of the semiconductor module, causing a transparent Ethylene Vinyl Acetate (EVA) resin or the like to fill the area between the reinforced glass plates, and then sealing the ends by means of a frame, could also be adopted.

7) The quantity, disposition, and form of the semiconductor devices mounted in the semiconductor module 20, 20A, 40, are not restricted to those of the above embodiments and can be set freely. For example, it is also possible to obtain a semiconductor module with a flexible, sheet-like structure by mounting a multiplicity of semiconductor devices in multiple rows and multiple columns on a thin sheet made of a transparent synthetic resin (with a thickness of 0.3 mm, for example), by connecting the multiplicity of semiconductor devices of each column in series and the semiconductor devices in each row in parallel by means of a conductive connection mechanism, and then molding a light transmitting member film on both sides of the sheet. Further, so too with the sheet-like semiconductor module, the semiconductor devices 10 can also be disposed in a plurality of layers.

8) The semiconductor module has been described by taking the example of a semiconductor module with a light receiving function. However, the semiconductor module of the present invention can also be applied in the same manner to a semiconductor module with a light emitting function. However, in this case, a semiconductor device with a light emitting function (a spherical semiconductor device, cylindrical semiconductor device, or granular semiconductor device) must be applied as the semiconductor device.

A variety of spherical light emitting diodes proposed by the inventors of the present invention in patent publications WO98/15983 and WO99/10935, and so forth, for example, can be applied as such a semiconductor device with a light emitting function. Light emitting diodes with other types of structure could also be adopted. Such a semiconductor module with a light emitting function can be applied to a planar light-emission type lighting device, a monochrome or color display, or various display devices, and so forth.

9) Moreover, the person skilled in the art is capable of implementing other embodiments made by applying a variety of modifications to the above embodiments without departing from the spirit of the present invention. The present invention is therefore not restricted to the variety of embodiments disclosed in the above embodiments.

The invention claimed is:

1. A unitary semiconductor device, comprising:
  a semiconductor element including a flat surface formed by removing an apex part of a substantially spherical semiconductor crystal made of a p⁻ type or n⁻ type semiconductor;
  a first exterior layer comprising a diffusion-mask film formed over the flat surface and extending beyond said flat surface over a neighboring area of said semiconductor element;
  a second exterior layer comprising a diffusion layer or semiconductor thin-film deposition layer formed on an outer surface of the semiconductor element excluding the flat surface and a substantially spherical pn junction formed with the semiconductor element via contact of the diffusion layer or semiconductor thin-film deposition layer, said substantially spherical pn junction being separated from a perimeter of said flat surface by a portion of said outer surface of said semiconductor element lacking a pn junction;
  a third exterior layer comprising an antireflective coating formed over the second exterior layer and not over the first exterior layer;
  a first electrode penetrating said first exterior layer so as to directly contact the flat surface of the semiconductor crystal;

a second electrode penetrating said third exterior layer so as to directly contact said second exterior layer at an apex on the opposite side of the flat surface; and said first and second electrodes facing each other with a center of the semiconductor element interposed therebetween.

2. The unitary semiconductor device according to claim 1, wherein the substantially spherical semiconductor crystal is fabricated by causing a semiconductor melt to solidify with the substantially spherical shape thereof maintained by utilizing a surface tension of the semiconductor melt.

3. The unitary semiconductor device according to claim 1 or 2, wherein, when a protrusion exists near the surface of the semiconductor crystal, the flat surface portion of the semiconductor element is formed by removing the protrusion.

4. The unitary semiconductor device according to claims 1 or 2, wherein said antireflective coating comprises a transparent insulating antireflection film.

5. The unitary semiconductor device according to claims 1 or 2, wherein the p-type or n-type semiconductor constituting the semiconductor crystal is a compound semiconductor selected from gallium arsenide (GaAs), indium phosphide (InP), gallium phosphide (GaP), gallium nitride (GaN), indium copper selenide (InCuSe), and silicon carbide (SiC).

6. The unitary semiconductor device according to claims 1 or 2, wherein the semiconductor device is a light emitting device.

7. The unitary semiconductor device according to claims 1 or 2, wherein the semiconductor device is a solar cell.

8. The unitary semiconductor device according to claims 1 or 2, wherein the semiconductor device is a photodiode.

9. The unitary semiconductor device according to claims 1 or 2, wherein the semiconductor device is a phototransistor.

10. The unitary semiconductor device of claim 1, wherein:

the second exterior layer is formed on substantially the outer surface of the semiconductor element excluding a partial surface area adjacent to said flat surface: and said first exterior layer covering a partial surface area of said second exterior layer.

11. The semiconductor device of claim 1, wherein a portion of said first exterior layer overlaps a portion of said second exterior layer.

12. A unitary semiconductor device, comprising:

a semiconductor element including a flax surface formed by removing an apex part of a substantially spherical semiconductor crystal made of a p⁻ type or n⁻ type semiconductor;

a first exterior layer comprising a diffusion-mask film formed over the flat surface;

a second exterior layer comprising a diffusion layer or semiconductor thin-film deposition layer formed on the outer surface of the semiconductor element excluding the flat surface and a substantially spherical pn junction formed via the diffusion layer or semiconductor thin-film deposition layer;

a portion of the first exterior layer overlaps a portion of the second exterior layer;

first and second electrodes;

said first electrode penetrating the first exterior layer and directly contacting the flat surface of the semiconductor crystal;

said second electrode directly contacting the second exterior layer at an apex on the opposite side to the flat surface;

said first and second electrodes facing each other with a center of the semiconductor element interposed therebetween.

13. A method of making a unitary semiconductor device, comprising:

a first step of making a substantially spherical semiconductor crystal made of a p⁻ type or n⁻ type semiconductor;

a second step of producing a semiconductor element which has a flat surface formed by removing an apex part or the semiconductor crystal;

a third step of forming a first exterior layer comprising a diffusion-mask film formed over the flat surface; and a fourth step of forming a second exterior layer comprising a diffusion layer or semiconductor thin-film deposition layer on the outer surface of the semiconductor element excluding the flat surface and forming a substantially spherical pn junction via the diffusion layer or semiconductor thin-film deposition layer;

a portion of the first exterior layer overlaps a portion of the second exterior layer;

the second exterior layer being formed subsequent to the forming of the first exterior layer;

a fifth step of forming first and second electrodes;

said first electrode penetrating the first exterior layer and directly contacting the flat surface of the semiconductor crystal;

said second electrode directly contacting the second exterior layer at an apex on the opposite side to the flat surface; and said first and second electrodes facing each other with a center of the semiconductor element interposed therebetween.

14. A method of making a unitary semiconductor device, comprising:

a first step or making a substantially spherical semiconductor crystal made of a p⁻ type or n⁻ type semiconductor;

a second step of producing a semiconductor element which has a flat surface formed by removing an apex part of the semiconductor crystal;

a third step of forming a first exterior layer comprising a diffusion-mask film formed over the flat surface;

a fourth step of forming a second exterior layer comprising a diffusion layer or semiconductor thin-film deposition layer on the outer surface of the semiconductor element excluding the flat surface and forming a substantially spherical pn junction via the diffusion layer or semiconductor thin-film deposition layer;

the second exterior layer being formed subsequent to the forming of the first exterior layer;

a fifth step of forming a third exterior layer comprising an antireflective coating over the second exterior layer and not over the first exterior layer; and a sixth step of forming first and second electrodes;

said first electrode penetrating said first exterior layer so as to directly contact the flat surface of the semiconductor crystal;

said second electrode penetrating said third exterior layer so as to directly contact said second exterior layer at an apex on the opposite side of the flat surface; and said first and second electrodes facing each other with a center of the semiconductor element interposed therebetween.

15. The method of claim 14, wherein:
in the third step, an insulating antireflection film is formed on the substantially spherical surface of the diffusion layer when the pn junction is formed; and,
in the sixth step, electrode materials are provided on the flat surface and at the apex on the opposite side to the flat surface respectively so as to face each other with the center of the semiconductor element interposed therebetween, and first and second electrodes are formed from this pair of electrode materials.

16. The method of making a unitary semiconductor device of claim 14, wherein:
the second exterior layer is formed on substantially the outer surface of the semiconductor element excluding a partial surface area adjacent to said flat surface; and
said first exterior layer covering a partial surface area of said second exterior layer.

17. The method of claim 14, wherein said sixth step comprises:
placing a first paste material on said first exterior layer at a location juxtaposed to said flat surface of the semiconductor crystal;
placing a second paste material on said third exterior layer at a location juxtaposed to said apex on the opposite side to said flat surface;
subsequently subjecting the semiconductor crystal to a gaseous medium; and
heating the semiconductor to effect said penetration of said first and second electrodes as said first and second electrodes are formed respectively from said first and second paste materials.

18. The method of claim 14, wherein a portion of said first exterior layer overlaps a portion of said second exterior layer.

19. A unitary semiconductor device, comprising:
a semiconductor element including a flat surface formed by removing an apex part of a substantially spherical semiconductor crystal;
a first exterior layer comprising a semiconductor thin film deposition layer formed on the outer surface of the semiconductor element excluding the flat surface and an area adjacent to said flat surface;
a second exterior layer comprising an antireflection film formed on the outer surface of the semiconductor device including said first exterior layer, said flat surface and said area adjacent to said flat surface;
a first electrode penetrating said second exterior layer so as to directly contact the flat surface of the semiconductor crystal;
a second electrode penetrating said second exterior layer so as to directly contact said first exterior layer at an apex on the opposite side of the flat surface; and
said first and second electrodes facing each other with a center of the semiconductor element interposed therebetween.

20. A unitary semiconductor device, comprising:
a semiconductor element including a flat surface formed by removing an apex part of a substantially spherical semiconductor crystal made of an $n^-$ type semiconductor;
a first exterior layer comprising a $p^+$ type base layer formed on the outer surface of the semiconductor element excluding the flat surface and an area adjacent to said flat surface so that a pn junction forms therebetween;
a second exterior layer comprising a first antireflection film formed on said flat surface and an area adjacent to said flat surface so as to overlap said first exterior layer;
a third exterior layer comprising an $n^-$ type emitter layer formed on said semiconductor device, said third layer having a first portion formed over said first exterior layer and a second portion diffused under a portion of said second exterior layer;
a fourth layer comprising a second antireflection film formed over said first portion of said third layer;
a first electrode penetrating said second exterior layer so as to directly contact the flat surface of the semiconductor crystal;
a second electrode penetrating said fourth exterior layer so as to directly contact said third exterior layer at an apex on the opposite side of the flat surface; and
said first and second electrodes facing each other with a center of the semiconductor element interposed therebetween.

21. A light transducing semiconductor device, comprising:
a semiconductor element configured as a substantially spherical semiconductor crystal having a substantially spherical surface portion and a flat surface portion adjoining the substantially spherical surface to form a chordal surface, the flat surface portion being disposed apart from a spherical center of the substantially spherical surface portion, the substantially spherical semiconductor crystal being made of a $p^-$ type or $n^-$ type semiconductor;
a first exterior layer comprising a diffusion-mask film disposed over the flat surface portion and a first outer surface portion of the substantially spherical surface, the first outer surface portion adjoining the flat surface portion;
a second exterior layer comprising a diffusion layer or semiconductor thin-film deposition layer formed in or on a second outer surface portion of the substantially spherical surface and not in or on the flat surface portion, the second exterior layer forming a substantially spherical pn junction with the p type or n type material of the substantially spherical semiconductor crystal, the substantially spherical pn junction having a pn junction perimeter adjacent to and spaced apart from the flat surface portion by a distance substantially defined by the first outer surface portion;
a third exterior layer comprising an antireflective coating disposed over the second exterior layer and not over the first exterior layer;
a first electrode in an aperture in said first exterior layer and conductively connected to the flat surface portion of the semiconductor crystal;
a second electrode in an aperture in said third exterior layer and conductively connected to said second exterior layer; and said first and second electrodes opposing each other with a center of the semiconductor element interposed therebetween.

22. The semiconductor device of claim 21, wherein said first exterior layer and the first outer surface portion surrounds said flat surface portion.

23. The semiconductor device of claim 22, wherein the third exterior layer is not over the first exterior layer.

24. The semiconductor device of claim 22, wherein the second electrode is at an apex of the substantially spherical portion opposite the flat surface portion.

25. The semiconductor device of claim 22, wherein said pn junction perimeter is covered by said first exterior layer.

26. The semiconductor device of claim 25, wherein the third exterior layer is not over the first exterior layer.

* * * * *